(12) United States Patent
Yamagata

(10) Patent No.: US 8,901,754 B2
(45) Date of Patent: Dec. 2, 2014

(54) SEMICONDUCTOR DEVICE AND MANUFACTURING METHOD THEREOF

(75) Inventor: Osamu Yamagata, Kanagawa (JP)

(73) Assignee: J-Devices Corporation, Usuki (JP)

(*) Notice: Subject to any disclaimer, the term of this patent is extended or adjusted under 35 U.S.C. 154(b) by 265 days.

(21) Appl. No.: 13/076,555

(22) Filed: Mar. 31, 2011

(65) Prior Publication Data

US 2011/0309503 A1  Dec. 22, 2011

(30) Foreign Application Priority Data

Jun. 22, 2010  (JP) .................................. 2010-141886

(51) Int. Cl.
*H01L 23/48* (2006.01)
*H01L 23/00* (2006.01)

(52) U.S. Cl.
CPC ................ *H01L 24/19* (2013.01); *H01L 24/20* (2013.01); *H01L 24/12* (2013.01); *H01L 24/97* (2013.01); *H01L 2224/12105* (2013.01); *H01L 2224/97* (2013.01); *H01L 2924/01004* (2013.01); *H01L 2924/01013* (2013.01); *H01L 2924/01029* (2013.01); *H01L 2924/01033* (2013.01); *H01L 2924/01082* (2013.01); *H01L 2924/01005* (2013.01); *H01L 2924/01006* (2013.01); *H01L 2924/014* (2013.01); *H01L 2224/32225* (2013.01); *H01L 2224/32245* (2013.01); *H01L 2224/92244* (2013.01); *H01L 2224/73267* (2013.01)
USPC ........... 257/786; 257/690; 257/735; 257/773; 257/781; 257/E23.02

(58) Field of Classification Search
USPC ......... 257/698, 738, 693, 786, 737, 780, 781, 257/784, E23.015, E23.02, E23.141, 673, 257/773, 776
See application file for complete search history.

(56) References Cited

U.S. PATENT DOCUMENTS

| 7,078,823 | B2* | 7/2006 | Thurgood ..................... 257/786 |
| 7,199,459 | B2* | 4/2007 | Pu et al. ......................... 257/686 |
| 2002/0195701 | A1 | 12/2002 | Bemmerl et al. |
| 2003/0109072 | A1 | 6/2003 | Meyer et al. |
| 2003/0178747 | A1 | 9/2003 | Bast et al. |
| 2004/0041251 | A1 | 3/2004 | Goller et al. |
| 2004/0126910 | A1 | 7/2004 | Thomas et al. |
| 2004/0140559 | A1 | 7/2004 | Goller et al. |
| 2004/0232543 | A1 | 11/2004 | Goller et al. |
| 2005/0014309 | A1 | 1/2005 | Hedler et al. |
| 2005/0017374 | A1 | 1/2005 | Kiendl et al. |

(Continued)

FOREIGN PATENT DOCUMENTS

| CN | 2009-44702 A | 9/2007 |
| JP | 05-259208 | 10/1993 |

(Continued)

OTHER PUBLICATIONS

Office Action issued by Japanese Patent Office dated Mar. 19, 2013 in Japanese application 2010-141886.

(Continued)

*Primary Examiner* — Jasmine Clark
(74) *Attorney, Agent, or Firm* — Staas & Halsey LLP

(57) ABSTRACT

A semiconductor device comprises a semiconductor chip having a plurality of electrode pads; an insulation layer having one or more apertures which expose at least a part of the plurality of electrode pads respectively on the semiconductor chip; and a plurality of wires which are electrically connected to the exposed plurality of electrode pads.

6 Claims, 20 Drawing Sheets

(56) References Cited

U.S. PATENT DOCUMENTS

| | | |
|---|---|---|
| 2005/0087851 A1 | 4/2005 | Fuergut et al. |
| 2005/0124093 A1 | 6/2005 | Yang et al. |
| 2005/0151246 A1 | 7/2005 | Daeche et al. |
| 2005/0184375 A1 | 8/2005 | Goller et al. |
| 2006/0091518 A1 | 5/2006 | Grafe et al. |
| 2006/0244142 A1 | 11/2006 | Waidhas et al. |
| 2007/0182029 A1 | 8/2007 | Franosch et al. |
| 2008/0029906 A1 | 2/2008 | Otremba |
| 2008/0142932 A1 | 6/2008 | Beer et al. |
| 2009/0160053 A1* | 6/2009 | Meyer et al. .................. 257/738 |

FOREIGN PATENT DOCUMENTS

| | | |
|---|---|---|
| JP | 08-111495 | 4/1996 |
| JP | 09-022924 | 1/1997 |
| JP | 2003-526208 | 9/2003 |
| JP | 2004-186688 | 7/2004 |
| JP | 2004-356649 | 12/2004 |
| JP | 2004-538641 | 12/2004 |
| JP | 2005-167191 | 6/2005 |
| JP | 2006-278450 | 10/2006 |
| JP | 2009-218621 | 9/2009 |

OTHER PUBLICATIONS

Japanese Notification of Reasons for Refusal dated Sep. 17, 2013 in Japanese application 2010-141886.

Taiwanese Office Action issued Mar. 4, 2014 in Taiwan Patent application 100105917.

* cited by examiner

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2010-141886, filed on 22 Jun. 2010, the entire contents of which are incorporated herein by reference.

FIELD

The present invention is related to a semiconductor device and a manufacturing method thereof. In particular, the present invention is related to a semiconductor device which has a high level of connection reliability and is suited to miniaturization of electrode pads on a semiconductor chip, and a method of manufacturing the same.

BACKGROUND

Conventionally, in a semiconductor device a wire bonding method is mainly used to connect electrode pads on a semiconductor chip and leads of the semiconductor package. For example, wire bonding technology is used in the semiconductor devices of patent document 1 (Japan Laid Open Patent H8-111495) and patent document 2 (Japan Laid Open Patent H-5-259208).

Here, wire bonding technology refers to connecting electrode pads and leads of a semiconductor package with a thin wire on a semiconductor chip obtaining an electrical connection.

In a semiconductor device which uses this wire bonding technology, as well as recent multi pin semiconductors and reduction in semiconductor chip size, fine pitch of electrode pads on a semiconductor chip, and lengthening and fine pitch of a wire in order to arrange multiple leads within the package are progressing.

However, when the length of a wire is increased and the pitch made finer, for example, the wire is transformed by the molded resin during a process for forming a resin package and adjacent wires may short. In addition, there is a limit to reducing the thickness of the entire package due to the loop height of a wire. Furthermore, a high level of positioning accuracy is required when accurately bonding a wire on a narrow electrode pad with a fine pitch.

The present invention provides a semiconductor device which has a high level of connection reliability, and is suited to miniaturization of electrode pads formed on a semiconductor chip.

SUMMARY

A semiconductor device related to one embodiment of the present invention includes a semiconductor chip having a plurality of electrode pads, an insulation layer having one or more apertures which exposes at least a part of the plurality of electrode pads respectively on the semiconductor chip, and a plurality of wires which are electrically connected to the plurality of electrode pads exposed in the apertures.

The semiconductor device related to one embodiment of the present invention, wherein the plurality of wires may have a lead shape which is narrower than the width of the plurality of electrode pads and wherein one end of the plurality of wires is connected to the plurality of electrode pads, and the other end of the plurality of wires extends at least up to the end of the semiconductor chip.

The semiconductor device related to one embodiment of the present invention, wherein the shape of the apertures may be a plurality of apertures which expose alternately an upper part and a lower part of each of the plurality of electrode pads on the semiconductor chip.

The semiconductor device related to one embodiment of the present invention, wherein the apertures may be formed for each function groups of the plurality of wires.

The semiconductor device related to one embodiment of the present invention, wherein the length of a wire of the plurality of wires which is electrically connected to at least one electrode pad (of the plurality of electrode pads) may be different to the length of a wire of the plurality of wires which is electrically connected to an adjacent electrode pad of the plurality of electrode pads.

The semiconductor device related to one embodiment of the present invention, wherein the plurality of wires may each be arranged across each of the plurality of apertures respectively.

The semiconductor device related to one embodiment of the present invention, wherein the length of a wire of the plurality of wires which is electrically connected to at least one electrode pad of the plurality of electrode pads may be shorter than the length of the electrode pad it is connected to.

The semiconductor device related to one embodiment of the present invention, wherein a part of a wire of the plurality of wires which is electrically connected to an electrode pad of the plurality of electrode pads in the apertures may have a cross shape.

The semiconductor device related to one embodiment of the present invention, wherein a part of a wire of the plurality of wires which is electrically connected to an electrode pad of the plurality of electrode pads in the apertures may have a round shape.

The semiconductor device related to one embodiment of the present invention, wherein at least two wires of the plurality of wires having the same function may be connected on the insulation layer and may be connected to a ball land used for connecting to an external terminal arranged on the insulation layer.

A method of manufacturing a semiconductor device related to one embodiment of the present invention includes forming an insulation layer on a semiconductor chip having a plurality of electrode pads, forming apertures which exposes at least a part of the plurality of electrode pads respectively in the insulation layer, and forming a plurality of wires which are electrically connected to the plurality of wires on the insulation layer.

According to the present invention, by forming apertures which exposes a plurality of electrodes pads on an insulation layer which is formed on electrode pads on a semiconductor chip, it is possible to increase the area of apertures more than a conventional via apertures. By increasing the area of apertures, it is possible to avoid apertures formation defects cause by photolithography. In addition, the semiconductor device of the present invention is suited to miniaturization of electrode pads formed on a semiconductor chip.

According to the present invention, by forming the terminal of the connecting parts of the plurality of electrode pads of the semiconductor chip and the wires as a long thin lead shape, the area of connection parts of the electrode pads of the semiconductor chip and the wires is increased. By increasing the area of connection parts, connection reliability of the semiconductor device is improved.

DESCRIPTION OF EMBODIMENTS

The present invention will be explained in detail below using the diagrams.

Recently, there is a method of manufacturing a semiconductor device such as an LSI unit or IC module as mentioned below, die bonding a plurality of semiconductor chips on one surface of a substrate having the same shape as a semiconductor wafer, and forming via apertures and wires etc. all together on a plurality of semiconductor chips by performing subsequent processes the same as a formation process used in the manufacture of a semiconductor wafer.

When manufacturing a semiconductor device for flip chip mounting using this manufacturing method, a technology has been used in which, instead of wire bonding technology, via apertures are arranged on an insulation layer and wires are formed in the apertures for connecting electrode pads on a semiconductor chip to wires formed on the insulation layer.

Figure 1:
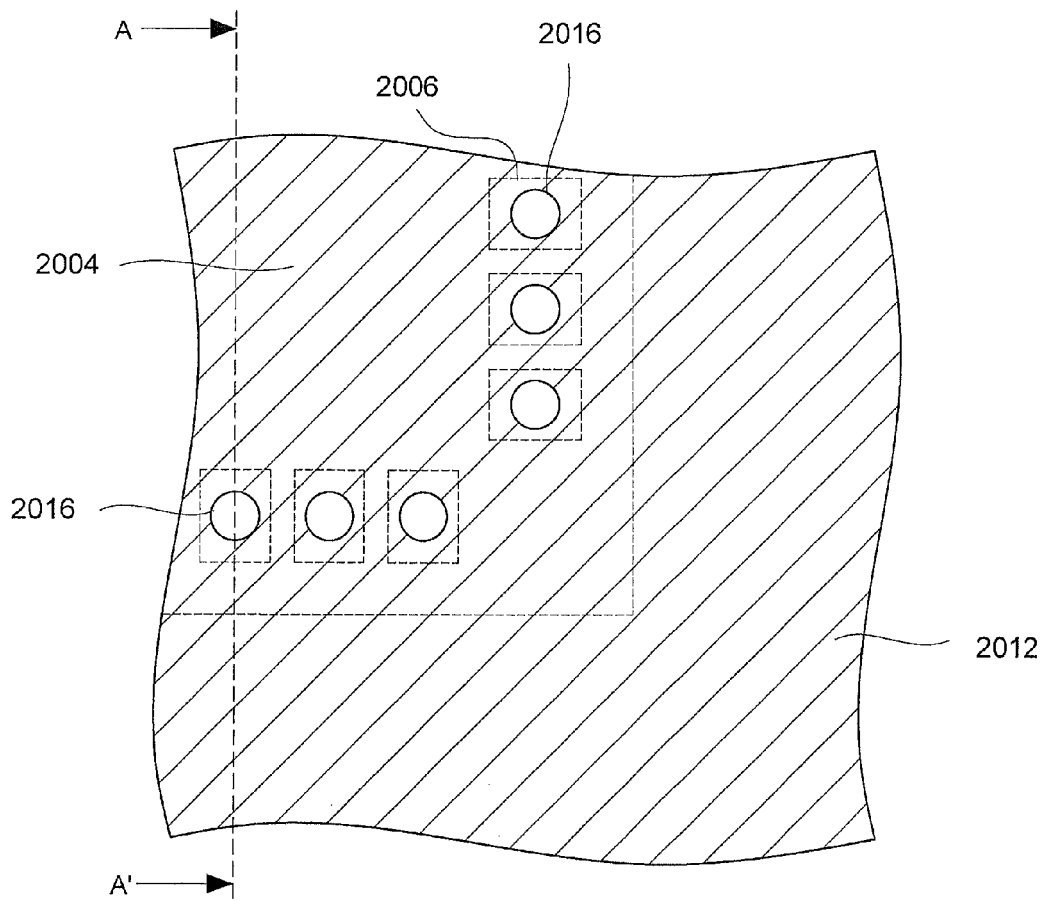
FIG. 1 is a plane view diagram which shows apertures formation of a first insulation layer in one part of a semiconductor device which uses a via apertures.

FIG. 1 is a plane view diagram which shows and expanded part in which via apertures 2016 is formed on an insulation layer 2012 on electrode pads 2006 which is arranged on a semiconductor chip 2004. As shown in FIG. 1, here, a round shaped via apertures 2016 are formed on the insulation layer.

The size of the electrode pad 2006 arranged on an element circuit surface of the semiconductor chip 2004 tends to decrease with increased integration of semiconductor elements.

Because the via apertures 2016 formed on the insulation layer 2012 in FIG. 1 are formed using photolithography technology, it is necessary to form very fine via apertures considering the possibility of the occurrence of mask misalignments. However, the smaller the via apertures area become with a reduction in the size of a semiconductor chip, it becomes increasingly difficult to form desired apertures due to the exposure limits of photolithography technology and mask misalignments. In addition, the thickness of the insulation layer 2012 formed in the semiconductor chip tends to increase in order to increase mounting reliability. As a result, formation of the via apertures 2016 becomes difficult.

Figure 2:
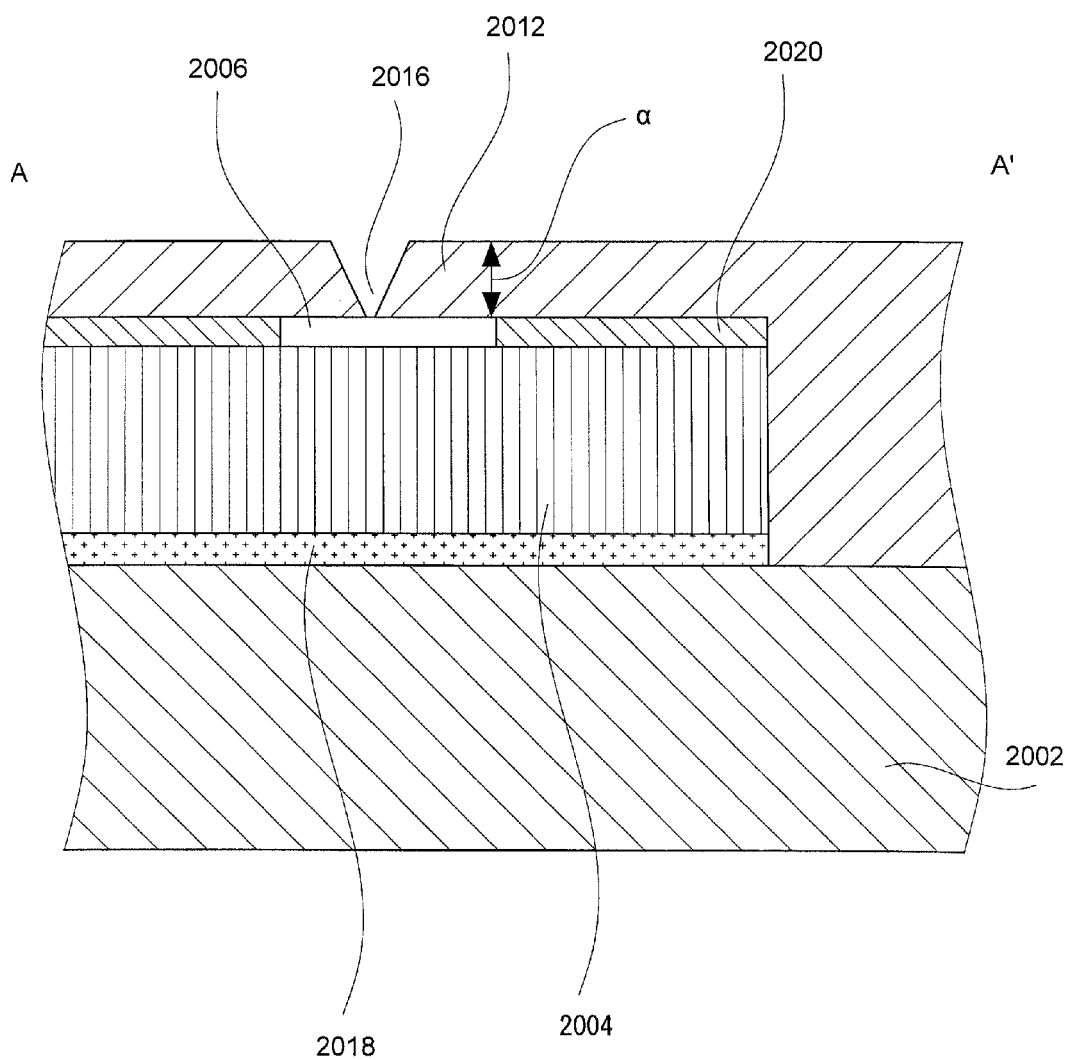
FIG. 2 is a cross sectional view of the line A-A' in FIG. 1 which shows an aperture formation of a first insulation layer in one part of a semiconductor device which uses a via apertures.

For example, as is shown in FIG. 2 (cross sectional view of via apertures) when the thickness a of the insulation layer 2012 formed on the semiconductor chip 2004 becomes thick, expose to the via apertures 2016 by photolithography is no longer sufficient, the shape of the apertures become cone shaped, and the electrical connection area between the wires 2008 and electrode pads 2006 formed in the next process may not be sufficiently obtained.

Figure 3:
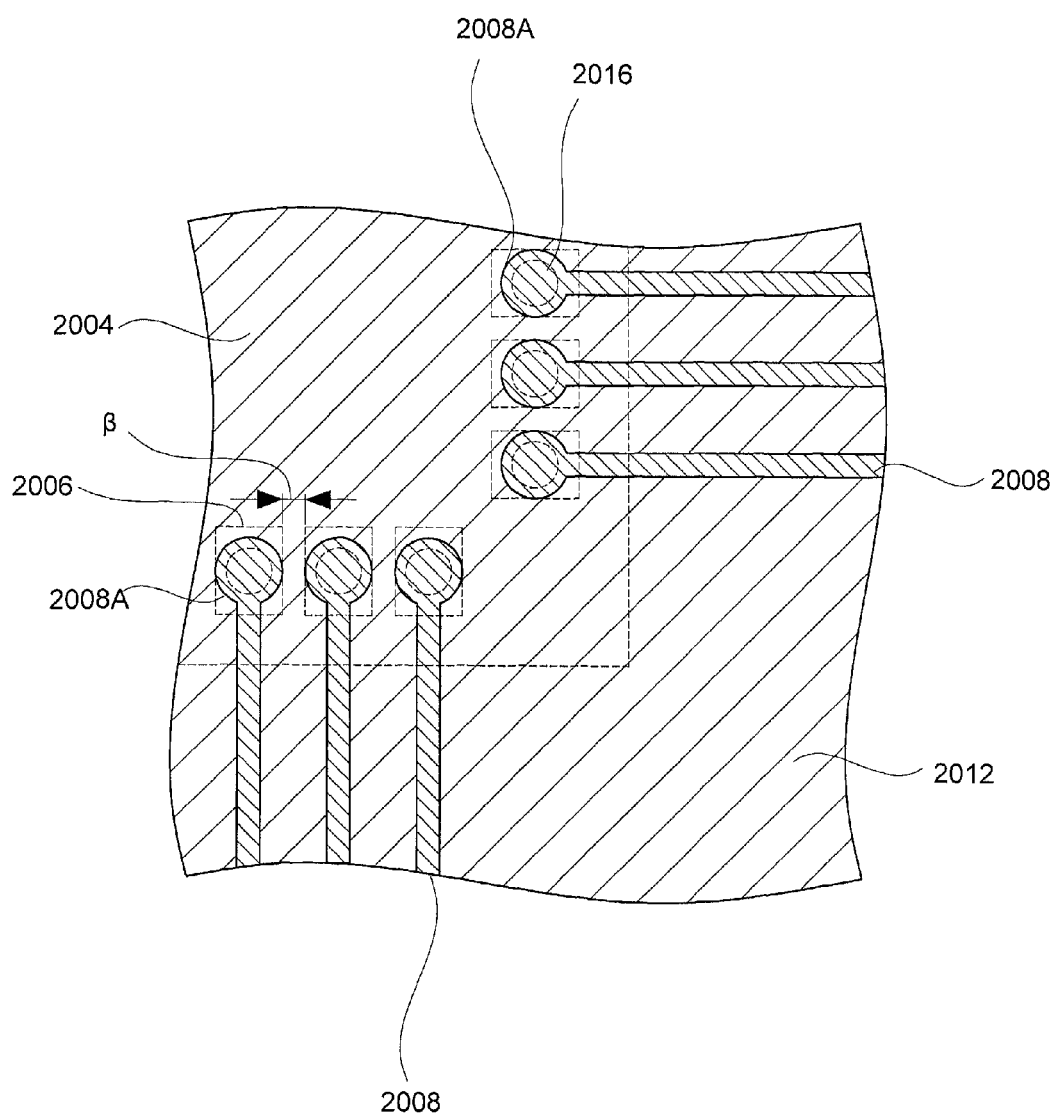
FIG. 3 is a plane view diagram which shows apertures formation of a first insulation layer in one part of a semiconductor device which uses a via apertures and the formation of the wires which are connected to the electrode pads.

FIG. 3 shows a plane view diagram of the formation of wires 2008 matched with the formation position of the via apertures in FIG. 2. In order to obtain electrical connection it is necessary to form connection parts 2008A larger than the via apertures 2016 considering misalignment caused by a mask of the via apertures 2016. As a result, it is also necessary to form the connection parts 2008A which connect the wires 2008 with electrode pads 2006 with a round shape to match the round shape of the via apertures 2016. However, as stated above, miniaturization of an arranged interval between electrode pads 2006 is progressing with higher integration of semiconductor chips. Consequently, when forming the via apertures 2016 on the insulation layer 2012 on the electrode pads 2006, the distance β between via apertures 2016 shown in FIG. 3 becomes shorter which sometimes leads to a significant reduction in resistance to leakage. Given the circumstances accompanying the miniaturization of semiconductor devices as stated above, the inventors of the present invention have developed a semiconductor device in which the reliability of the connection between an electrode pad and wires of a semiconductor chip is improved and the burden of position matching is reduced during manufacture.

The embodiments of the present invention will be explained below while referring to the Diagrams. Furthermore, the same structural elements have the same reference numerals and overlapping explanations between embodiments are omitted.

First Embodiment

Figure 4:
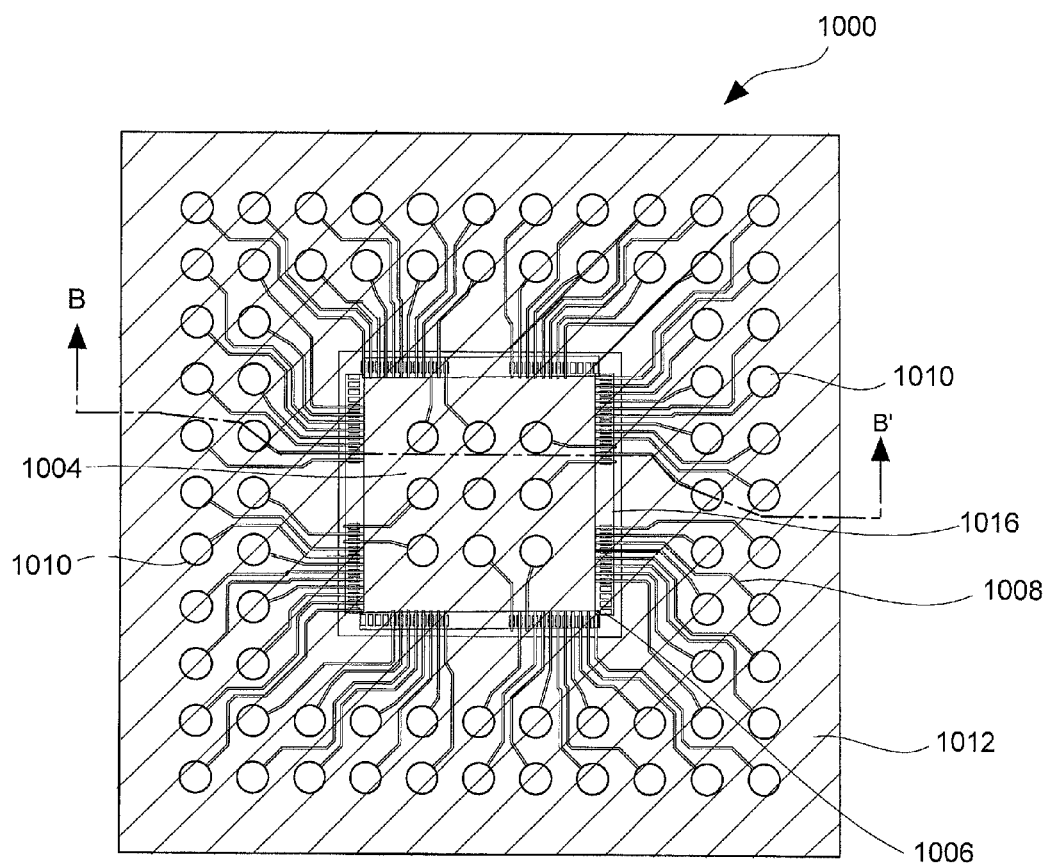
FIG. 4(A) is a transparent plane view diagram of a semiconductor device related to one embodiment of the present invention.
FIG. 4(B) is a cross sectional schematic diagram seen from the line B-B' in FIG. 4(A)
Figure 4:
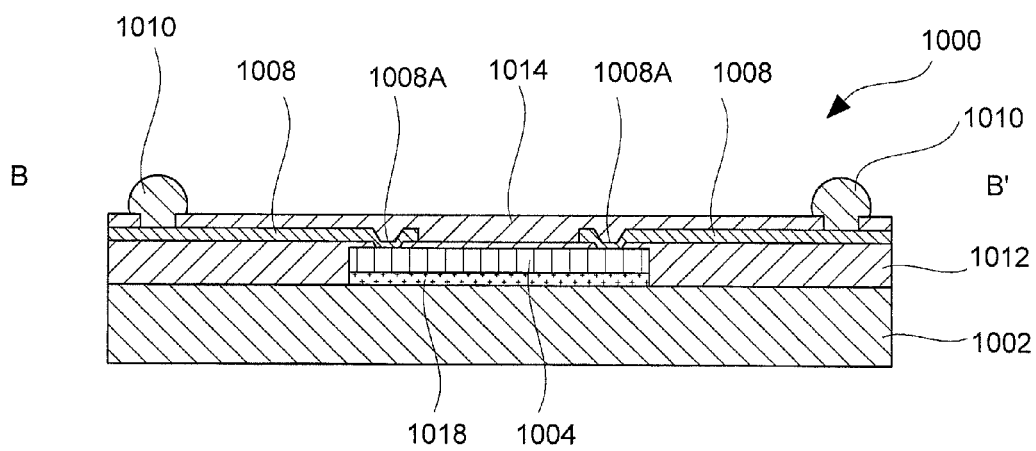

The semiconductor device related to the first embodiment of the present invention is explained below while referring to the Diagrams.
(Structure of the Semiconductor Device)
FIG. 4(A) and FIG. 4(B) show a general structure of the semiconductor device related to the first embodiment. FIG. 4(A) is a transparent plane view which shows a general structure of a semiconductor device 1000 and FIG. 4(B) is a cross sectional view of the semiconductor device 1000 seen from the line B-B' shown in FIG. 4(A). In FIG. 4(A) and FIG. 4(B), the semiconductor device 1000 is arranged with a substrate 1002, a semiconductor chip 1004 which is arranged on the substrate 1002 and includes a plurality of electrode pads 1006, a plurality of wires 1008 which are electrically connected to the plurality of electrode pads 1006, a plurality of solder balls 1010 arranged on the plurality of wires 1008 and which are electrically connected to the plurality of wires 1008, a first insulation layer 1012 which covers an upper layer of the semiconductor chip 1004, and a second insulation layer 1014 which covers the substrate 1002, the plurality of electrode pads 1006, the plurality of wires 1008 and a plurality of apertures 1016 but does not cover the plurality of solder balls 1010.

In FIG. 4(A) the apertures 1016 are formed on the first insulation layer 1012 so that the upper layer of the plurality of electrode pads 1006 is exposed from the first insulation layer 1012. In this case, the apertures 1016 is formed as one aperture so that the plurality of electrode pads 1006 are exposed together on the semiconductor chip 1004. However, the shape of the apertures 1016 is not limited to this and may be appropriately changed according to the shape of the electrode pads and position of arrangement. A specific example of another shape of the apertures 1016 will be explained in other embodiments below. In FIG. 4(B), 1018 is an adhesion layer for adhering the semiconductor chip 1004 on the substrate 1002. In addition, in FIG. 4(B), 1008A are connection parts which connect the wires 1008 and electrode pads 1006.

Figure 5:
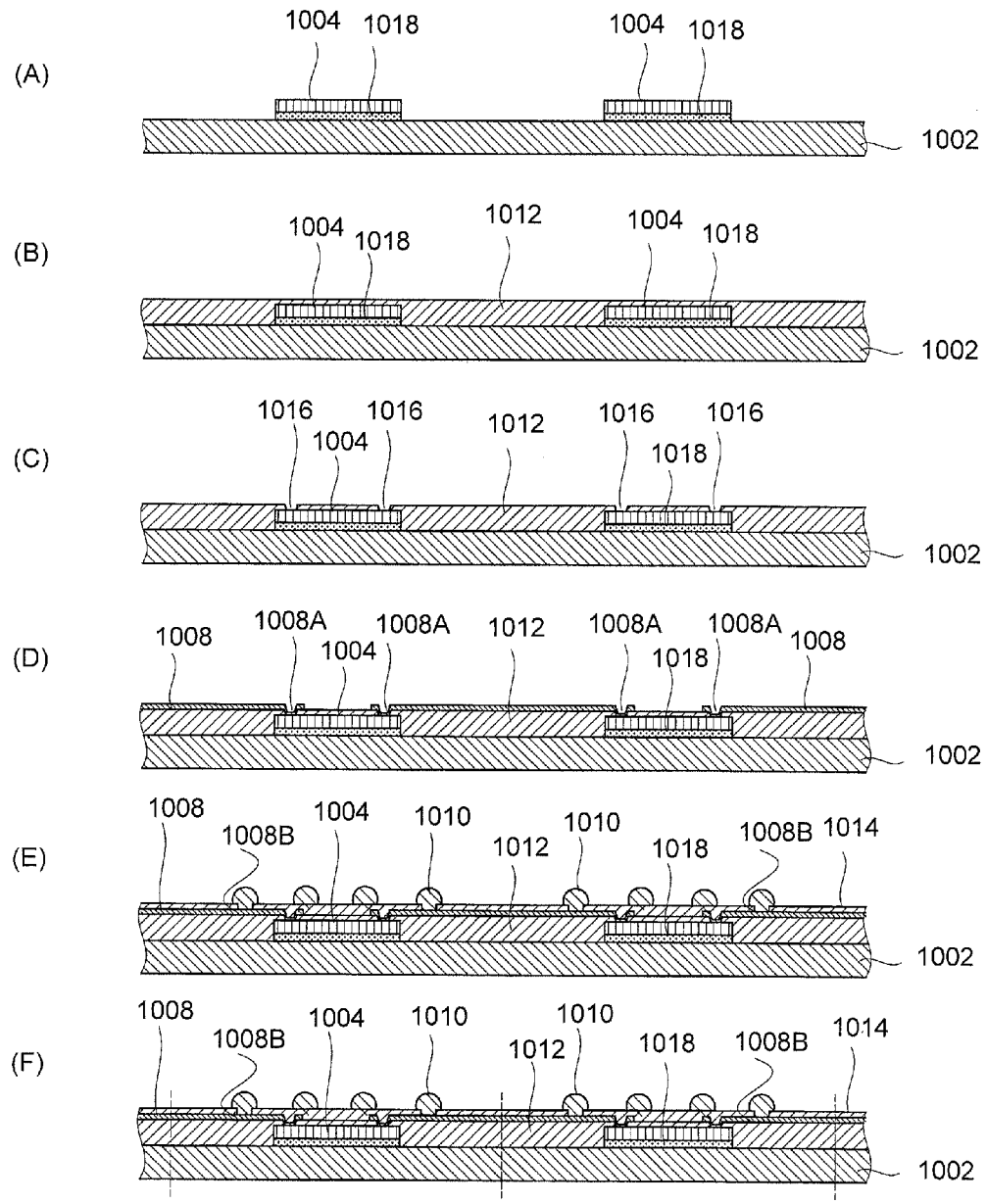
FIG. 5 is a cross sectional diagram which shows a manufacturing method of a semiconductor device related to one embodiment of the present invention.
Figure 8:
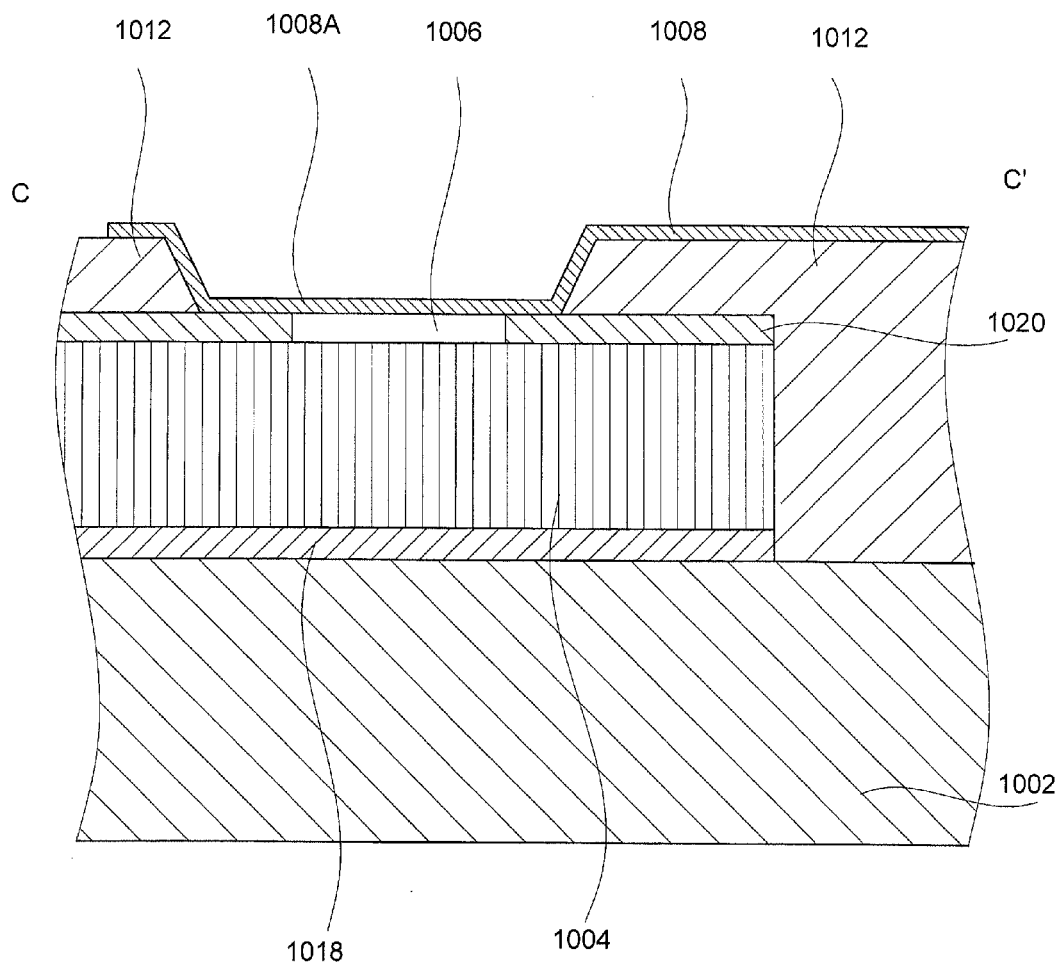
FIG. 8(A) is a cross sectional view see from the line C-C' in FIG. 7 which shows a wire which is connected to an electrode pad in a semiconductor device related to one variation of embodiment of the present invention.
FIG. 8(B) is a cross sectional view see from the line C-C' in FIG. 7 which shows a wire which is connected to an electrode in a semiconductor device related to one variation of embodiment of the present invention.
FIG. 8(C) is a cross sectional view see from the line C-C' in FIG. 7 which shows a wire which is connected to an electrode in a semiconductor device related to one variation of embodiment of the present invention.
Figure 8:
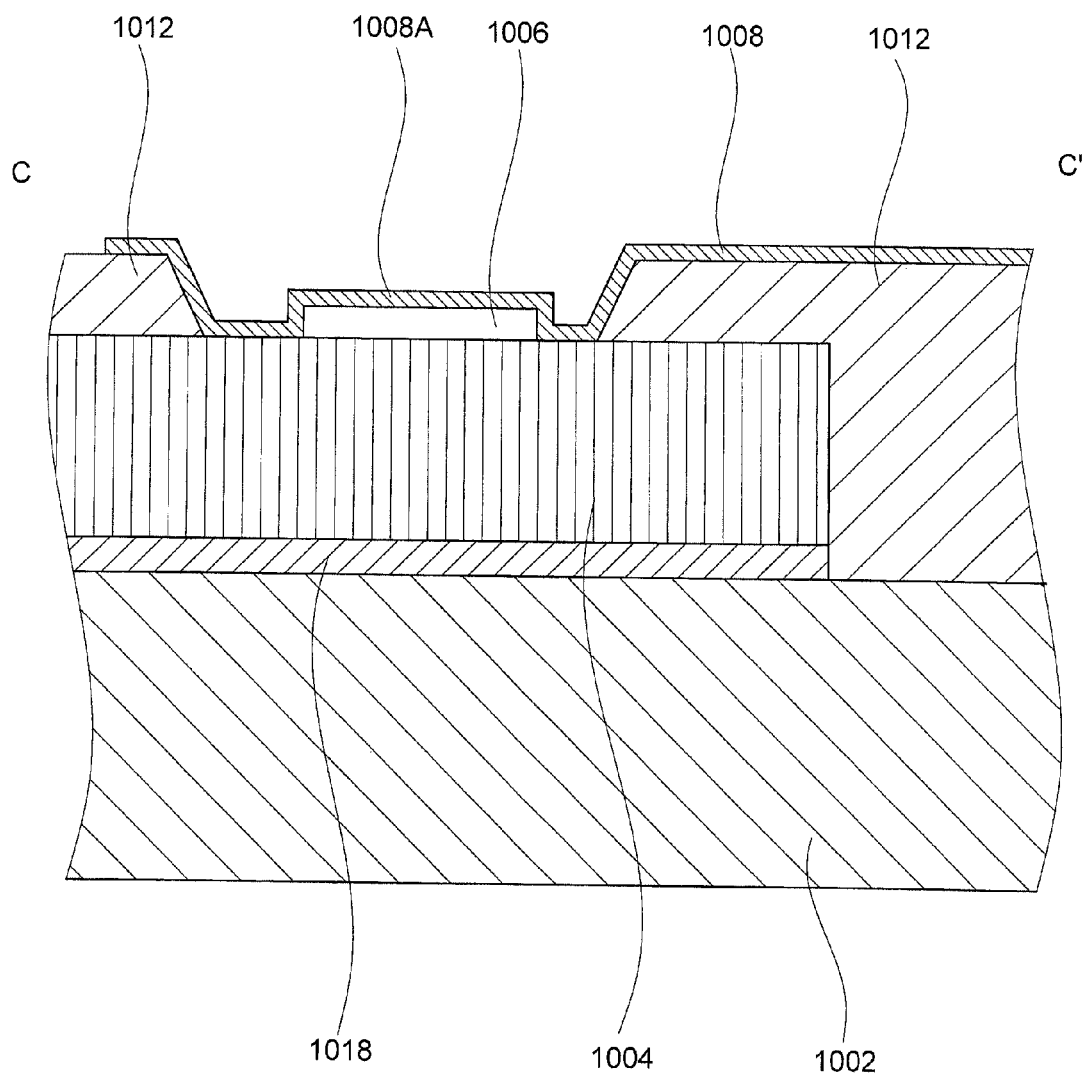
Figure 8:
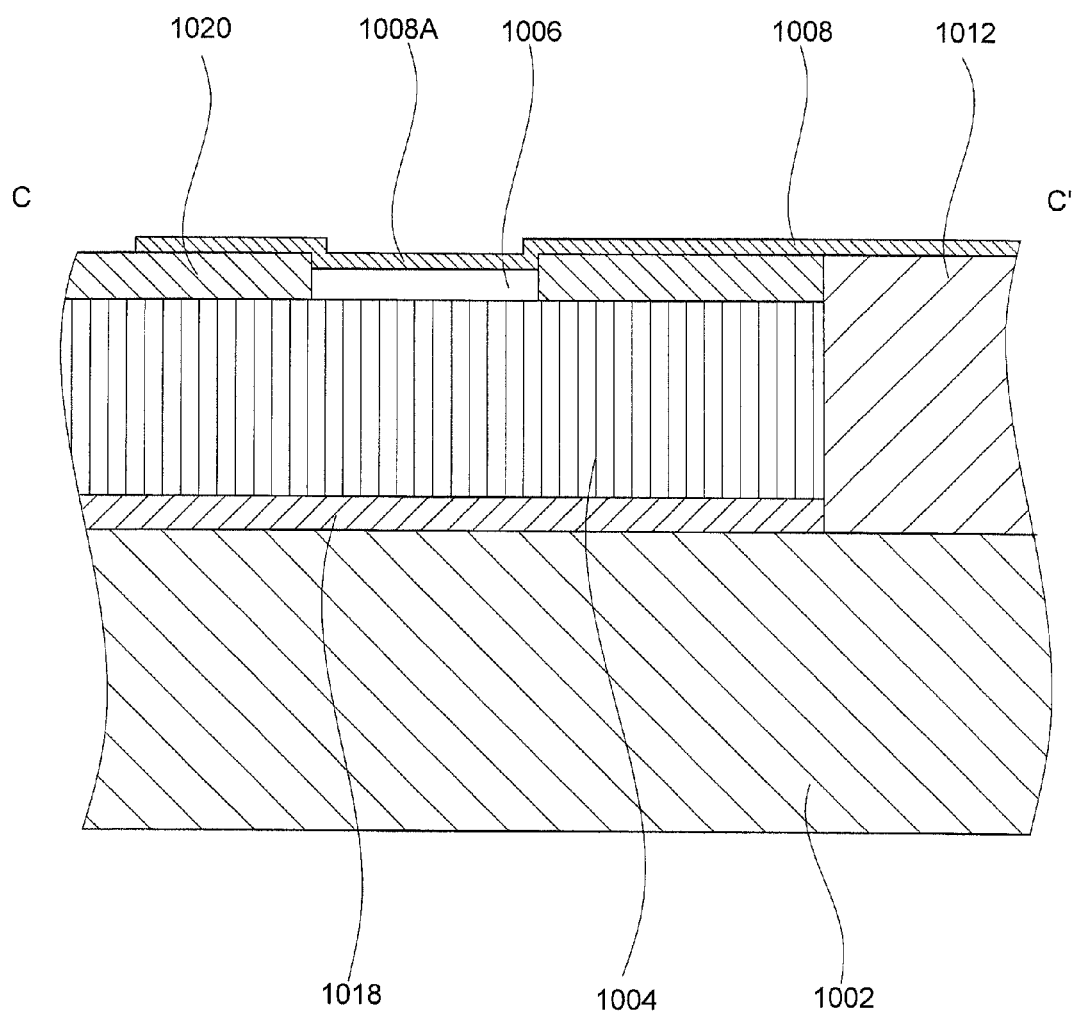

In FIG. 4(A) and FIG. 4(B), the plurality of wires 1008 are formed across the apertures 1016 on the first insulation layer 1012 and pass through the plurality of electrode pads 1006. Each of the wires 1008 have a long thin lead shapes and does not change even in the connection parts 1008A with the electrode pads 1006. As is shown in FIG. 4(A), by forming the apertures 1016 to expose the plurality of electrode pads all together, the apertures area becomes wider compared to each individual via apertures shown in FIG. 3, and an electrical connection between the electrode pads 1006 and the wires 1008 become easier. As a result, it is no longer necessary that the connection parts 1008A of the wires 1008 be formed in round shapes in order to increase the connection areas as shown in FIG. 3. In addition, it is no longer necessary to accurately form the wires matching the formation position of the round via apertures as shown in FIG. 3, resulting in leeway when positioning a mask when patterning by photolithography and forming the wires.
(Manufacturing Method of the Semiconductor Device)
Next, the manufacturing method of the semiconductor device 1000 shown in FIG. 4(A) and FIG. 4(B) will be explained while referring to FIG. 5(A) to FIG. 5(F). FIG. 5(A) to FIG. 5(F) are cross sectional views which shows each manufacturing process which forms the first insulation layer 1012, apertures 1016, wires 1008, second insulation layer 1014 and solder balls 1010 in order. Furthermore, an explanation of the manufacturing method of the semiconductor chip 1004 itself is omitted.
(1) Adhesion of the Semiconductor Chip (see FIG. 5(A))
First, in FIG. 5(A) a plurality of adhesion layers 1018 is formed on the substrate 1002 at certain intervals using an adhesive, and the semiconductor chip 1004 is adhered to each adhesion layer 1018. The substrate 1002 is a flat plate having a uniform thickness and is comprised from a resin hardened body with a hardened insulation resin, or metal such as stainless steel, 42 alloy, Al and silicon and includes an area which can be mounted with a plurality of semiconductor chips 1004. As is shown in FIG. 8(A) and FIG. 8(C), a protective film 1020 may be formed on the upper surface of the semiconductor chip 1004 except the electrode pads 1006, and as is shown in FIG. 8(B) a protective film 1020 does not have to be formed on the upper surface of the semiconductor chip 1004 except the electrode pads 1006. Furthermore, the plurality of electrode pads 1006 as shown in FIG. 4(A) and FIG. 8(A) to FIG. 8(C) are formed on the upper surface of each semiconductor chip 1004 in the Diagrams.
(2) Formation of the First Insulation Layer (See FIG. 5(B) and FIG. 8(A) to FIG. 8(C)).
Next, the first insulation layer 1012 is formed on the upper surface of the substrate 1002 after the plurality of semiconductor chips 1004 shown in FIG. 5(A) are adhered. The insulation material used for the first insulation layer 1012 is a resin for example, epoxy resin, polymide resin, polybenzoxazole resin (PBO), novolak resin, phenol resin, acrylic resin, urethane resin, silicon resin, PPS (polyphenylsulfide), polyethylene terephthalate (PET) polyethylene (PE) or a combination resin with novolak resin and phenol being the main components. The insulation material used for the first insulation layer 1012 does not have to be photosensitive but is required to have insulation properties. In addition, it is preferable that the insulation material used for the first insulation layer 1012 includes sufficient heat resistance to withstand a process when connecting the solder balls 1010 which are external terminals to the semiconductor device or a reflow process when mounting the semiconductor device. For example, a combined resin such as WRP series manufactured by JSR Ltd which includes a novolak resin and phenol resin as its main components can be given as a specific example of the insulation material used for the first insulation layer 1012.

As is shown in FIG. 8(A), in the case where a protective film 1020 is formed on the upper surface of the semiconductor chip 1004 except the electrode pads 1006, the first insulation layer 1012 may be formed up to and above the protective film 1020 so that the first insulation layer 1012 has a thickness equal to or more than the thickness of the semiconductor chip 1004, and as is shown in FIG. 8(C) the first insulation layer 1012 may be formed to have the same thickness as the thickness of the semiconductor chip 1004 including the protective film 1020 and the first insulation layer 1012 is not formed above the protective film 1020.

Alternatively, as is shown in FIG. 8(B), in the case where the protective film 1020 is not formed on the upper surface of the semiconductor chip 1004 except the electrode pads 1006, the first insulation layer 1012 is formed above the protective film 1020 so that the first insulation layer 1012 has a thickness equal to or more than the thickness of the semiconductor chip 1004.

Figure 6:
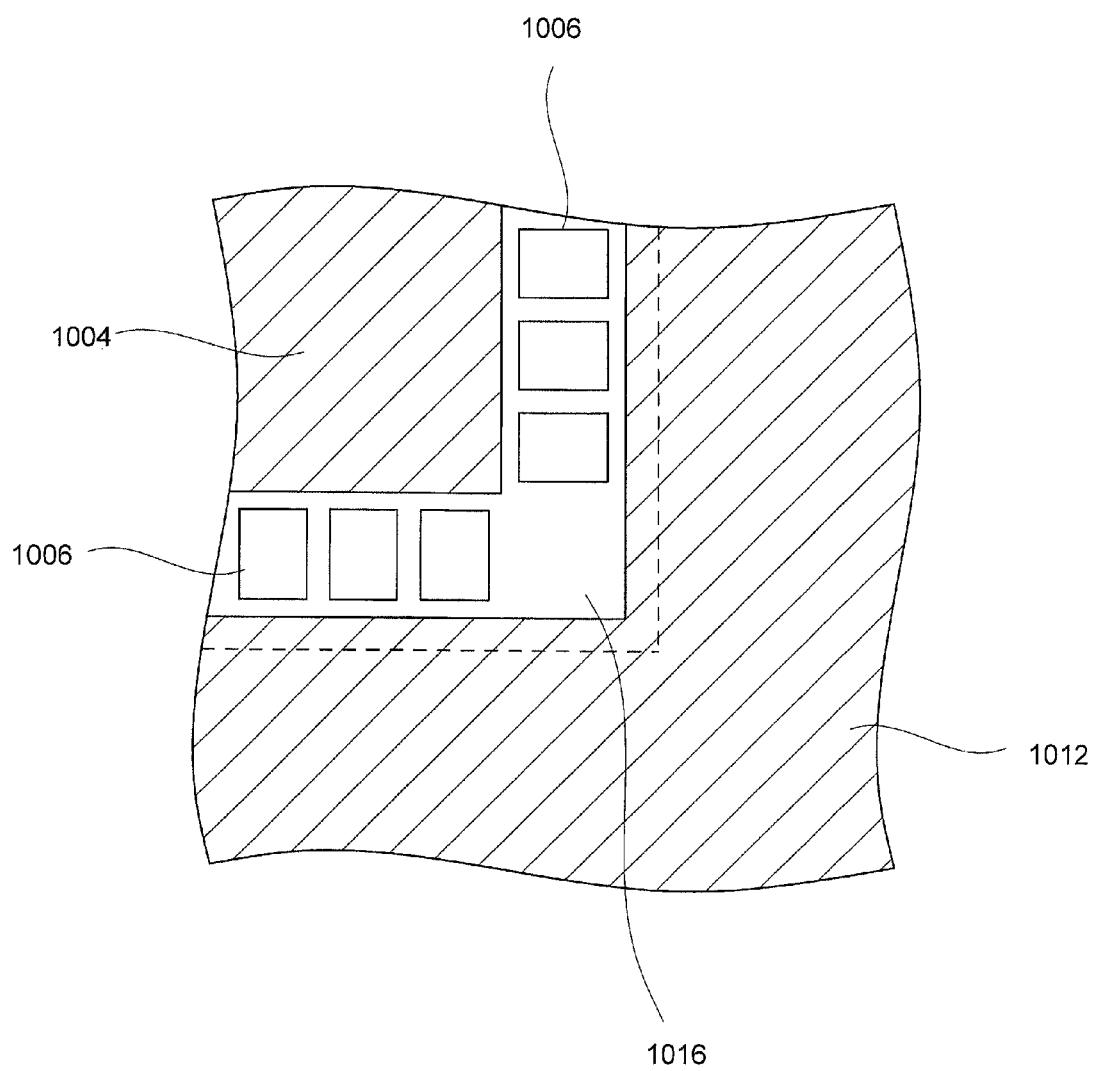
FIG. 6 is a plane view diagram shows apertures formation of a first insulation layer in one part of a semiconductor device related to one embodiment of the present invention.

(3) Formation of Apertures (See FIG. 5(C) and FIG. 6)

Next, in FIG. 4(A), a mask is prepared (not shown in the diagram) for forming a pattern for forming apertures 1016 for exposing the plurality of electrode pads 1006 on each semiconductor chip 1004 at once and the apertures is formed by etching the first insulation layer 1012 using the mask. The size of the apertures 1016 is larger than the size of the electrode pad 1006 and an expanded view of the part which forms the aperture 1016 is shown in FIG. 6.

(4) Formation of Wires (See FIG. 5(D), FIG. 7 and FIG. 8(A) to FIG. 8(C))

Next, in FIG. 5(D) a conducting metal layer such as copper is formed on the entire upper surface of the first insulation layer 1012 using a method such as electrolytic plating. Next, the conducting metal layer which is formed on the entire surface if patterned using photolithography and a plurality of wires 1008 is formed. Patterning by photolithography is performed by forming a photosensitive resist layer on the conducting metal layer, and after exposure and developing with a mask pattern, etching the conducting metal layer.

By patterning using electrolytic plating and photolithography it is possible to manufacture at once the connection parts 1008A of wires which is electrically connected to the electrode pads 1006 of the semiconductor chip 1004, the wire 1008, and the connection parts 1008B of the external electrode pads on the wire layer in which the solder balls 1010 are formed in a post process.

Figure 7:
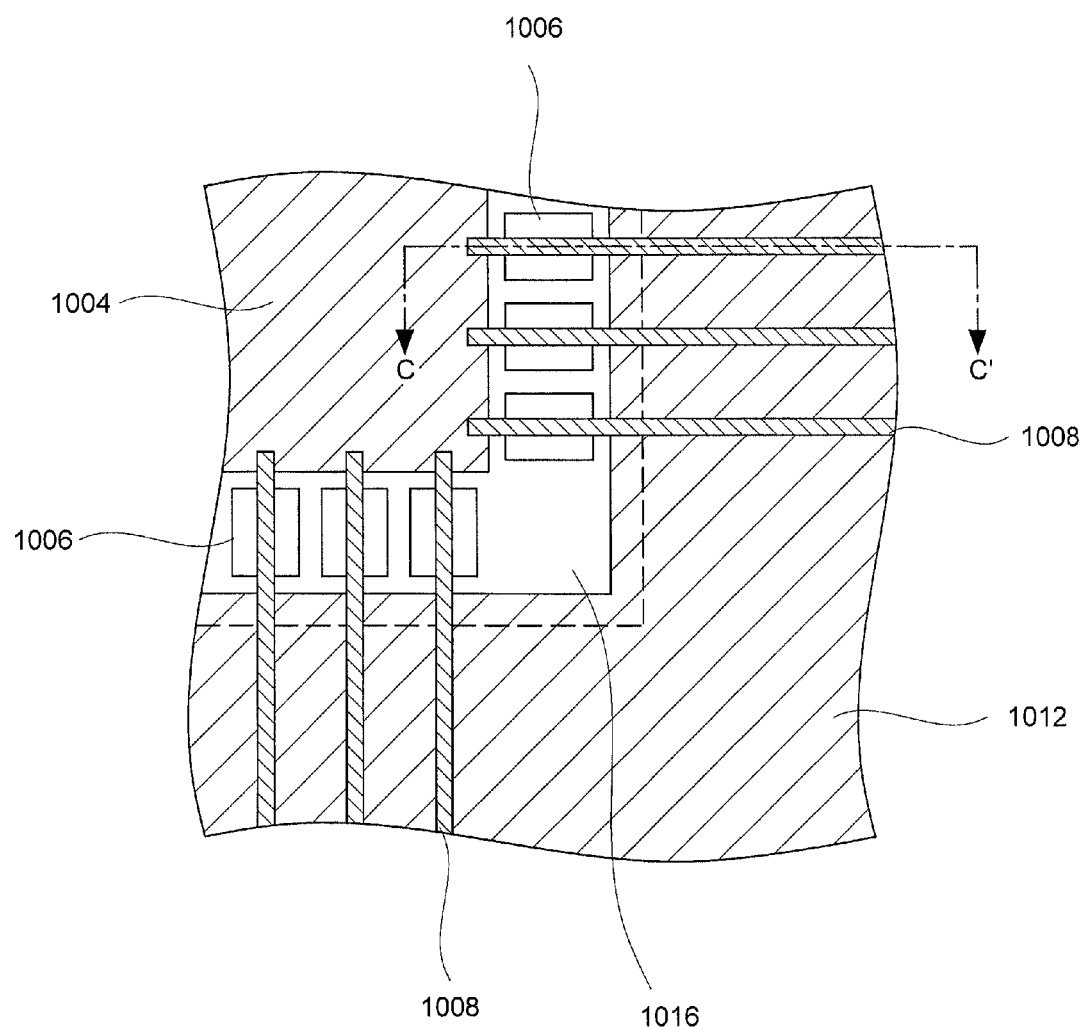
FIG. 7 is a plane view diagram which shows the formation of wires which is connected to the electrode pads on one part of a semiconductor device related to a first embodiment of the present invention.

At this time, a conducting metal layer is formed within the apertures 1016 of the first insulation layer 1012 and wires 1008 which electrically connects the electrode pads 1006 on the semiconductor chip 1004 and the conducting metal layer on the first insulation layer 1012 is formed. An expanded plane view of parts of the wires 1008 which are connected to the electrode pads 1006 of FIG. 5(D) is shown in FIG. 7. As is shown in FIG. 7, the wires 1008 which are connected to the electrode pads 1006 are formed so as to across the apertures 1016 of the first insulation layer 1012.

A cross sectional view of the wire 1008 which is connected with the electrode pad 1006 is shown in FIG. 8(A) to FIG. 8(C). FIG. 8(A) to FIG. 8(C) are cross sectional views seen form the line C-C' shown in FIG. 7. As is shown in FIG. 8(A) to FIG. 8(C), the wire 1008 which is connected to the electrode pad 1006 is formed matching the shape of the aperture 1016 of the first insulation layer 1012 and an electrical connection is obtained by also forming the wire 1008 above the electrode pad 1006 on the semiconductor chip 1004. 1020 in FIG. 8(A) and FIG. 8(C) is an organic film which protects the semiconductor chip 1004. The organic film 1020 is often provided when manufacturing a semiconductor chip. The organic film 1020 is shown in FIG. 8(A) and FIG. 8(C), however, a semiconductor chip which is not formed with a protective film 1020 as shown in FIG. 8(B) may also be used.

Figure 9:
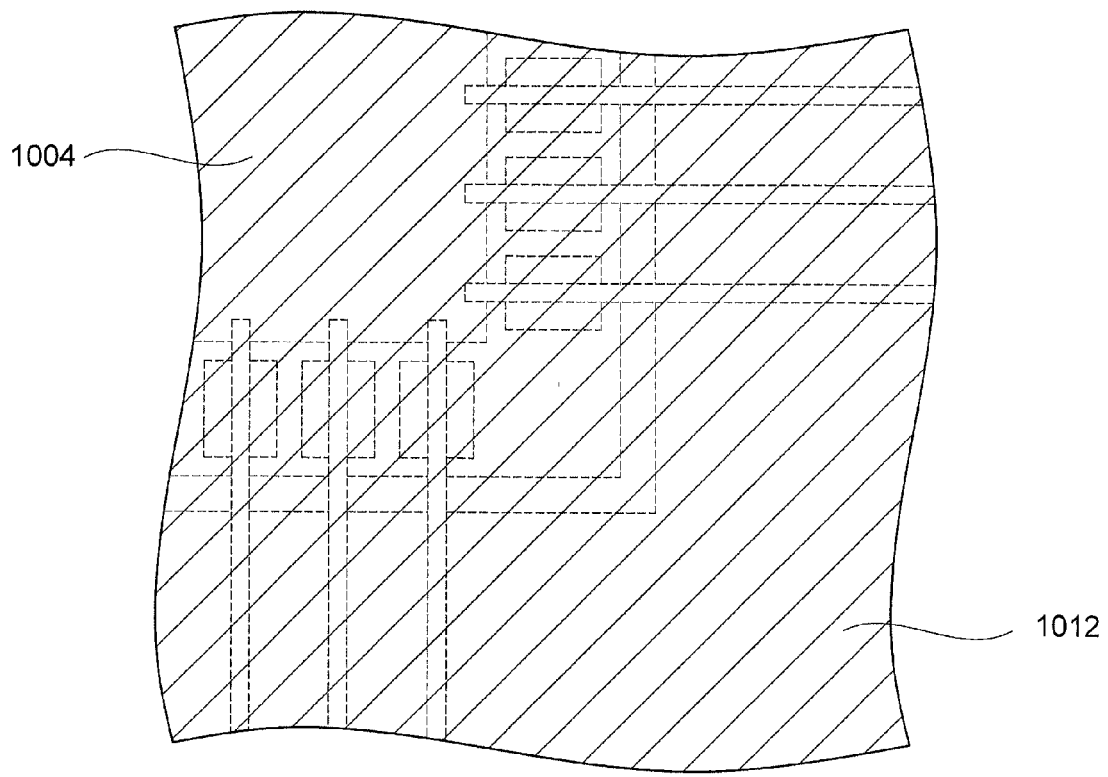
FIG. 9 is a transparent plane view diagram which shows the state of a wire film coated by second insulation layer, the wire being connected to electrode pads in one part of a semiconductor device related to the present invention.

(5) Formation of a Second Insulation Layer (See FIG. 5(E) and FIG. 9)

Next, in FIG. 5(E), a second insulation layer 1014 is formed in a certain region except above the first insulation layer 1012 and the connection parts 1008B of the external electrode above the wires 1008. At this time, as is shown in FIG. 9, the periphery of the connection part 1008A of the wire 1008 which is connected to the electrode pad 1006 and the apertures 1016 are covered by the second insulation layer 1014.

Because the second insulation layer 1014 is an insulation layer, mutual insulation between the connection parts 1008A of the wires 1008 which is connected to the electrode pads 1006 is obtained. The insulation material used for the second insulation layer 1014 does not have to be photosensitive, however it is required to have insulation properties. The type of insulation material used for the second insulation layer 1014 may include the same type of insulation material used for the first insulation layer 1012. In addition, the insulation material used for the second insulation layer 1014 may be the same material as that insulation material used for the first insulation layer 1012 and it may be different.

(6) Formation of a Solder Ball (See FIG. 5(E))

In FIG. 5(E), solder balls 1010 are formed on the connection parts 1008B of the wires 1008. Because one part of the wires 1008 on the first insulation layer 1012 is extended as far as the periphery region of the semiconductor chip 1004, the solder balls 1010 which are arranged on the connection parts 1008B of the external electrode of the wires 1008 are arranged in series on the substrate 1002 which includes the periphery region of the semiconductor chip 1004. As is shown in FIG. 4(A), the solder balls 1010 may be arranged in a grid array on the entire region of the substrate 1002 including the periphery region of the semiconductor chip 1004. Furthermore, the solder balls formed and arranged in a grid array as shown in FIG. 4(A) are called BGA. In addition, the second insulation layer 1014 is formed above the first insulation layer 1012 and above the wire 1008 except the connection part 1008B of the solder balls 1010.

Figure 10:
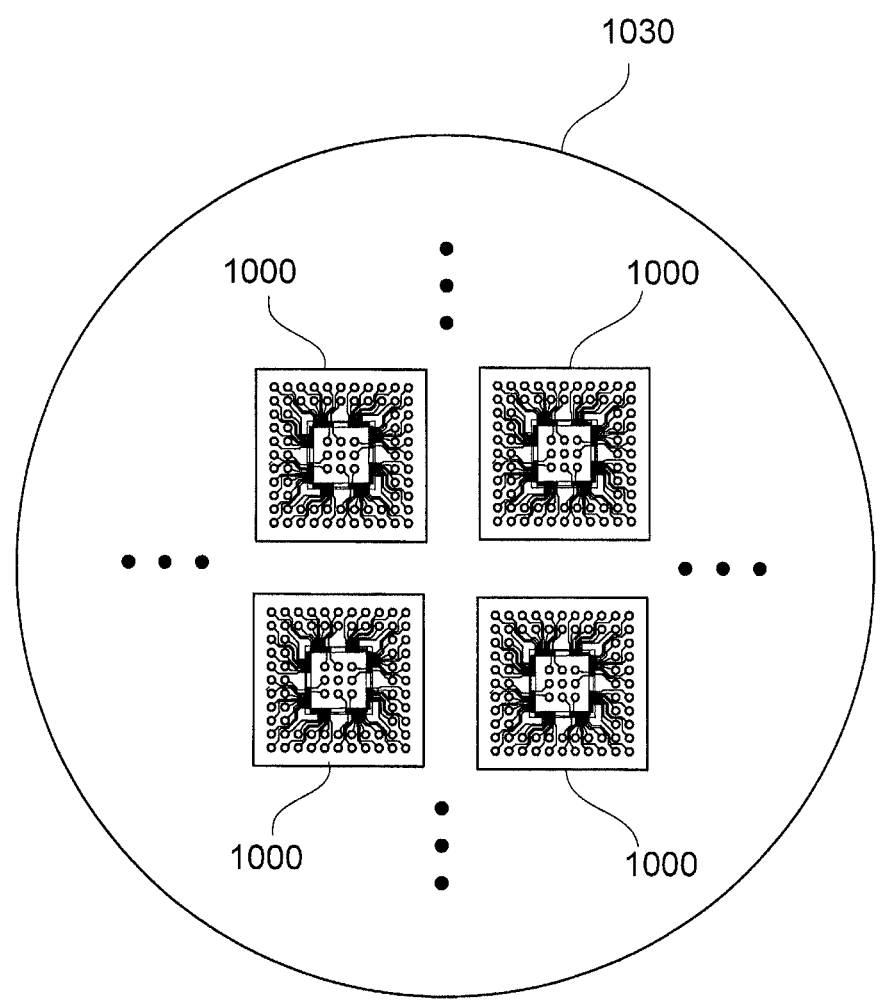
FIG. 10 is a plane view diagram of a round shaped substrate on which a plurality of semiconductor devices related to one embodiment of the present invention is integrally formed.

(7) Individuating (See FIG. 5(F) and FIG. 10)

Next, in FIG. 5(F), individuating is performed by dicing a wafer into a plurality of semiconductor devices 1000 shown by the dotted line in the diagram.

The semiconductor chips 1004 which are individually cut from the semiconductor wafer are again arranged on a round substrate 1002, adhered and fixed as shown in FIG. 10. Processes such as resin sealing, formation of apertures 1016 for forming wires which is connected to electrode pads and formation of the solder balls 1010 are performed on the round substrate 1030 shown in FIG. 10 at once. Following this, as is shown in FIG. 5(F), the substrate 1030 and insulation layer are diced at positions between each semiconductor chip and each semiconductor device 1000 is separated. In this way, the semiconductor device 1000 of the first embodiment is completed.

Furthermore, it is possible to perform the processes after the formation of the apertures after cutting the first insulation layer 1012 which is formed in a pre-process so as to cover the plurality of semiconductor chips at once, into certain shapes (for example, a round wafer shape), and processing, and by cutting the substrate into a round shape etc. and processing it is possible to perform each subsequent process similar to the formation process used for manufacturing the semiconductor wafer.

In this way, die bonding a plurality of semiconductor chips on a substrate having the same shape as a semiconductor wafer, and performing each subsequent process similar to the formation process used for manufacturing the semiconductor wafer, it is possible to manufacture at once the via apertures and wires etc. all together on a plurality of semiconductor chips.

According to the first embodiment of the present invention by forming apertures which exposes a plurality of electrode pads on a first insulation layer formed above electrode pads on a semiconductor chip, it is possible to increase the size of the apertures area more than a conventional via apertures. By increasing the size of the apertures area it is possible to avoid apertures formation defects caused by photolithography. In addition, it is possible to accommodate miniaturization of electrode pads formed on a semiconductor chip. Furthermore, by forming a connection pads between a plurality of electrode pads and wires of a semiconductor chip in a lead shape it is possible to increase the area of the parts which electrically connects the electrode pads and wire of the semiconductor chip. By increasing the area of connection parts, connection reliability of the semiconductor device is improved and because the apertures are covered by the second insulation layer it is possible increase the connection strength between the electrode pads and wires.

Second Embodiment

A semiconductor device related to the second embodiment of the present invention is explained while referring to the Diagrams. The second embodiment of the present invention explains an example in which the number of apertures in the semiconductor device 1000 related to the first embodiment is changed.

Figure 11:
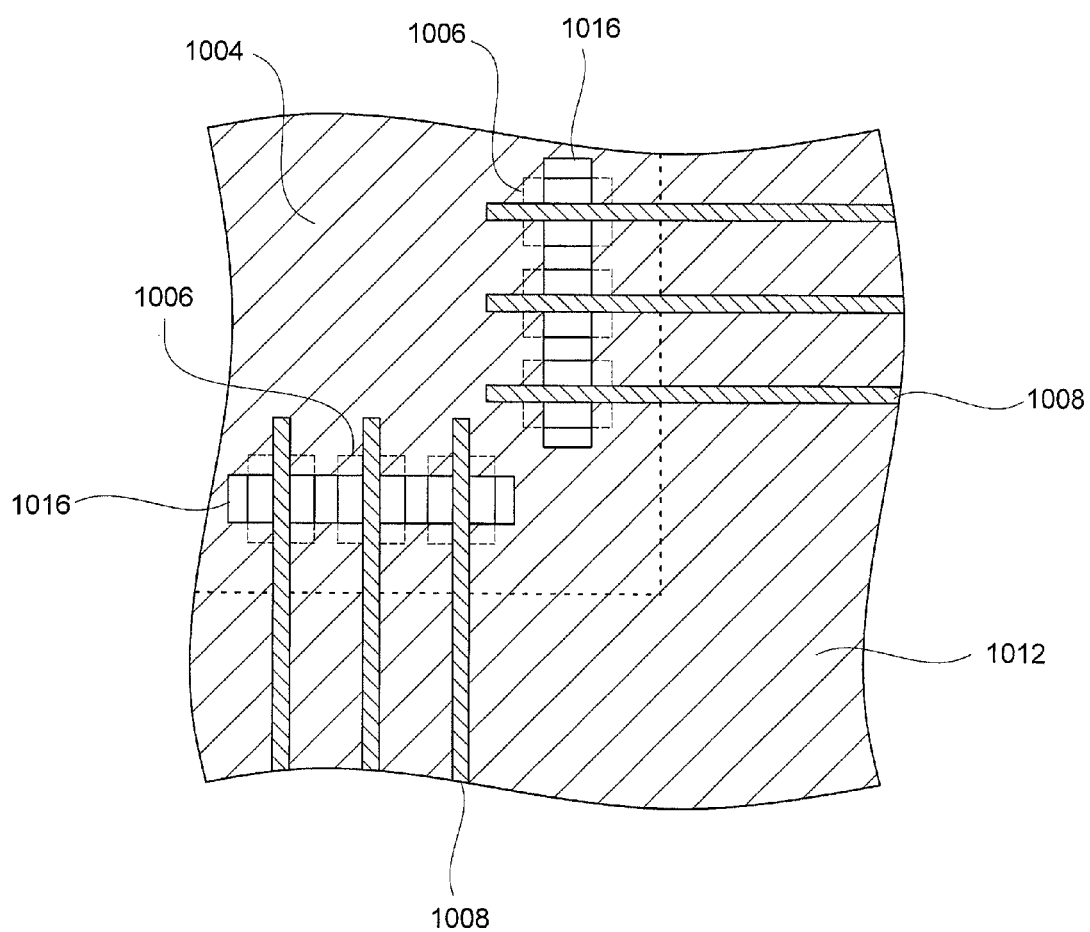
FIG. 11 is a plane view diagram which shows apertures formation of a first insulation layer and the formation of wires connected to the electrode pads in one part of a semiconductor device related to a second embodiment of the present invention.

FIG. 11 shows a general structure of the semiconductor device related to the second embodiment. Furthermore, in the diagram, the second insulation layer 1014 is omitted and because the second insulation layer 1014 is explained in the first embodiment an explanation is omitted here. In addition, the semiconductor device related to the second embodiment has a different number of apertures: however, because the structure of the semiconductor device other than this is the same as that explained in the first embodiment, diagrams and structural explanations are omitted here.

As is shown in FIG. 11, the semiconductor device 1000 related to the second embodiment includes a plurality of apertures 1016 on a first insulation layer 1012 and the plurality of apertures 1016 are formed for each group comprised of a plurality of mutually adjacent electrode pads 1006. In FIG. 11, the plurality of electrode pads 1006 are divided into four groups for each edge of the semiconductor chip 1004 and apertures 1016 is formed for each group. However, the embodiments of the present invention are not limited to this example. As long as two or more adjacent electrode pads are included in each group, multiple groups are possible. The remaining structure and manufacturing method is the same as the first embodiment. According to the second embodiment of the present invention, it is possible to form apertures 1016 without concern for misalignments caused by a mask. Furthermore, it is also possible to prevent short circuits between wires 1008 which are arranged near to the corners of the semiconductor chip 1004.

Third Embodiment

A semiconductor device related to the third embodiment of the present invention is explained while referring to the diagrams. The third embodiment of the present invention explains a different structural example to the second embodiment in which the number of apertures in the semiconductor device 1000 related to the first embodiment is changed.

Figure 12:
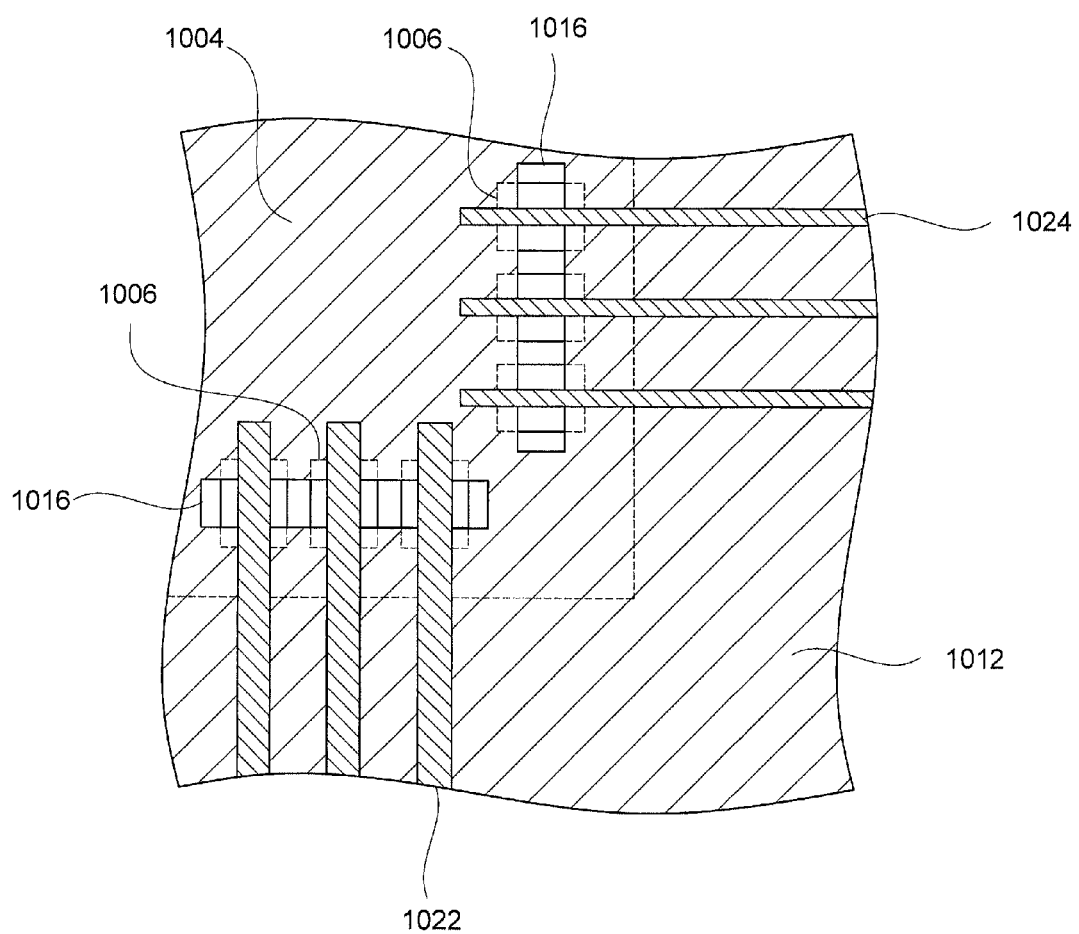
FIG. 12 is a plane view diagram which shows apertures formation of a first insulation layer and the formation of wires connected to the electrode pads in one part of a semiconductor device related to a third embodiment of the present invention.

FIG. 12 shows a general structure of the semiconductor device 1000 related to the third embodiment. Furthermore, in the diagram, the second insulation layer 1014 is omitted and because the second insulation layer 1014 is explained in the first embodiment an explanation is omitted here.

As is shown in FIG. 12, the semiconductor device 1000 related to the third embodiment includes a plurality of apertures 1016 on a first insulation layer 1012, are formed for each type of wires 1008 and the same type of wires 1008 are adjacent to each other. The type of wires may be for example a signal wire 1024, a power supply wire 1022 or a ground wire 1026. In FIG. 12, apertures 1016 is formed for each adjacent plurality of signal wires 1024 and power supply wires 1022. However, the type of wire is not limited to this example. If it is the same type of wire, apertures 1016 may be formed for each of the wires of a different type. By arranging apertures 1016 for each type of wires it is possible to prevent short circuits between wires of different types. The remaining structure and manufacturing method is the same as the first embodiment.

Fourth Embodiment

A semiconductor device 1000 related to the fourth embodiment of the present invention is explained while referring to the diagrams. The fourth embodiment of the present invention explains an example in which the length of the connection parts 1008A of the wires which are connected to the electrode pads 1006 in the semiconductor device 1000 related to the first embodiment is changed.

Figure 13:
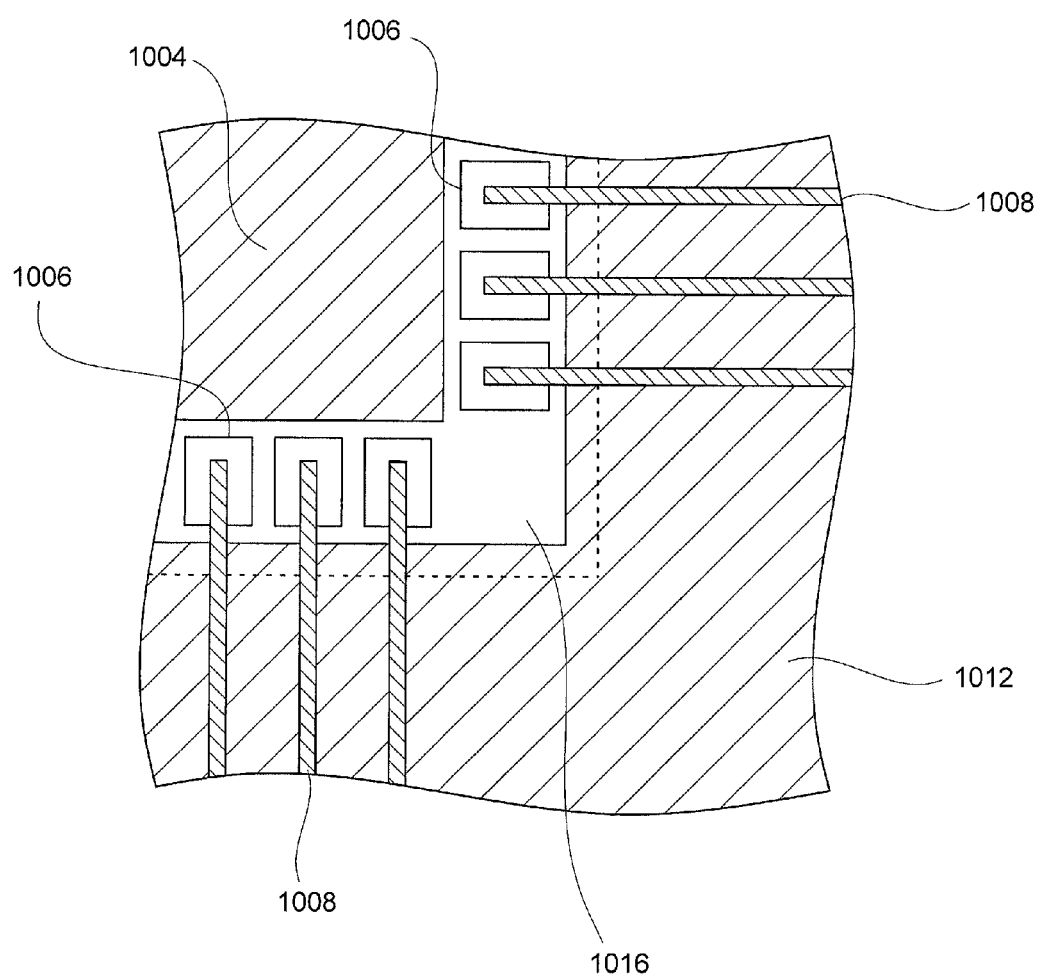
FIG. 13 is a plane view diagram which shows apertures formation of a first insulation layer and the formation of wires connected to the electrode pads in one part of a semiconductor device related to a fourth embodiment of the present invention.

FIG. 13 shows a general structure of the semiconductor device 1000 related to the fourth embodiment. Furthermore, in the diagram, the second insulation layer 1014 is omitted and because the second insulation layer 1014 is explained in the first embodiment an explanation is omitted here.

As is shown in FIG. 13, in the semiconductor device 1000 related to the fourth embodiment, the length of the connection parts 1008A of the wires 1008 which are connected to the electrode pads 1006 are shorter than the length of the electrode pads 1006 in a length direction. If the length of the connection parts 1008A of the wires which are connected to the electrode pads 1006 are sufficient to obtain an electrical connection, it is possible to secure electrical conduction even if the wires 1008 are not formed across the electrode pads 1006. In addition, by reducing the length of the wires connection parts 1008A, it is possible to reduce the amount of conductive material used for forming the wires 1008 when manufacturing the semiconductor device.

Fifth Embodiment

A semiconductor device 1000 related to the fifth embodiment of the present invention is explained while referring to the diagrams. The fifth embodiment of the present invention explains a different structural example to the fourth embodiment whereby the length of the connection parts 1008A of the wires 1008 which is connected to the electrode pads 1006 in the semiconductor device 1000 related to the first embodiment is changed.

Figure 14:
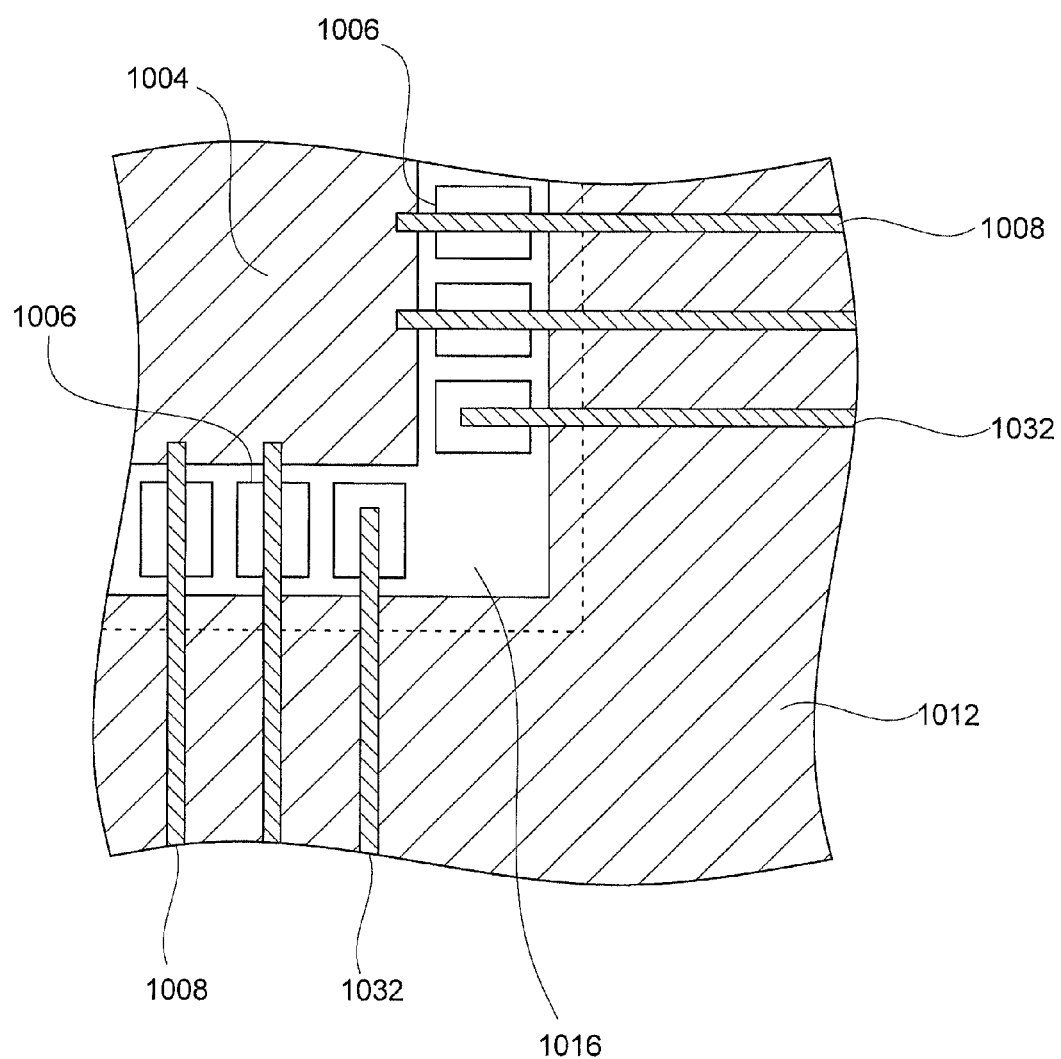
FIG. 14 is a plane view diagram which shows apertures formation of a first insulation layer and the formation of wires connected to the electrode pads in one part of a semiconductor device related to a fifth embodiment of the present invention.

FIG. 14 shows a general structure of the semiconductor device 1000 related to the fifth embodiment. Furthermore, in the diagram, the second insulation layer 1014 is omitted and because the second insulation layer 1014 is explained in the first embodiment an explanation is omitted here.

As is shown in FIG. 14, in the semiconductor device 1000 related to the fifth embodiment, the length of the connection parts 1008A of the wires 1008 which are connected to the electrode pads 1006 are shorter than the length of the electrode pads 1006 adjacent to the electrode pads 1006 described in the fourth embodiment in a length direction. In FIG. 14, the length of the connection parts 1008A of the wires 1032 which are connected to the electrode pads 1006 arranged nearest to the corner of the semiconductor chip 1004 is shorter than the length of the wires 1008 which are connected to the adjacent electrode pads 1006 in a length direction. However, the position where wires having different lengths are arranged is not limited to this example. In the wire structure of FIG. 14, it is possible to prevent short circuits between connection parts 1008A of wires 1032 which are connected to the electrode pads 1006 arranged nearest the corner part of the semiconductor chip 1004. The remaining structure and manufacturing method is the same as the first embodiment.

Sixth Embodiment

A semiconductor device 1000 related to the sixth embodiment of the present invention is explained while referring to the diagrams. The sixth embodiment of the present invention explains an example whereby the shape of the apertures 1016 and the shape of the connection parts 1008A of the wires 1008 which are connected to the electrode pads 1006 in the semiconductor device 1000 related to the first embodiment is changed.

Figure 15:
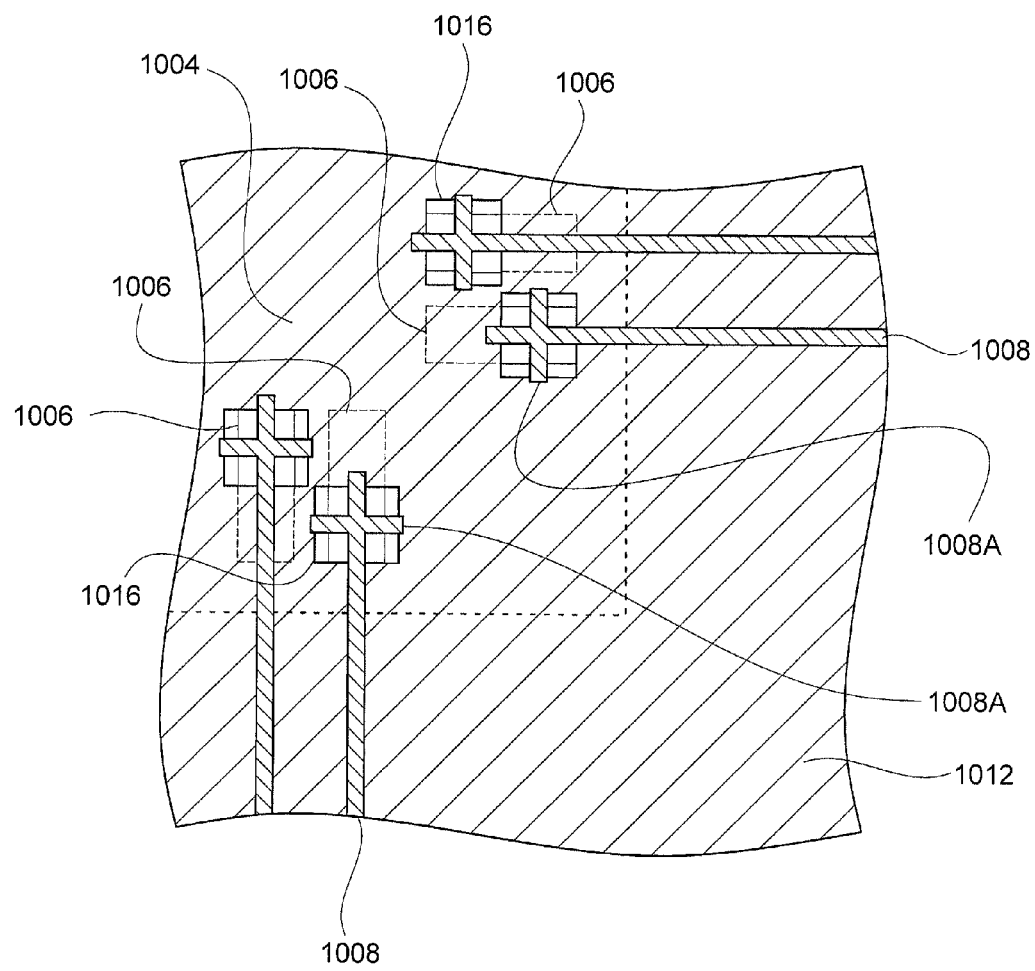
FIG. 15 is a plane view diagram which shows apertures formation of a first insulation layer and the formation of wires connected to the electrode pads in one part of a semiconductor device related to a sixth embodiment of the present invention.

FIG. 15 shows a general structure of the semiconductor device 1000 related to the sixth embodiment. Furthermore, in the diagram, the second insulation layer 1014 is omitted and because the second insulation layer 1014 is explained in the first embodiment an explanation is omitted here.

As is shown in FIG. 15, the shape of the apertures 1016 may be a plurality of apertures 1016 which expose the upper part and lower part of each electrode pads 1006 formed on the semiconductor chip 1004 alternately. In addition, the shape of the connection parts 1008A of the wire 1008 which are connected to the electrode pads 1006 formed in each apertures 1016 may be a cross shape. By making the shape of the connection parts 1008A of the wires 1008 which are connected to the electrode pads 1006 formed in each apertures 1016 a cross shape, it is possible to widen the connection area between the wire and electrode pad and secure an electrical connection. Furthermore, the shape of the connection parts 1008A of the wires 1008 which are connected to the electrode pads 1006 formed in each apertures 1016 are not limited to a cross shape. For example, the shape of the connection part 1008A may also be a round shape or other shape. The remaining structure and manufacturing method is the same as the first embodiment.

Seventh Embodiment

A semiconductor device 1000 related to the seventh embodiment of the present invention is explained while referring to the diagrams. The seventh embodiment of the present invention explains a different example to the example in the sixth embodiment whereby the shape of the apertures 1016 and the shape of the connection part 1008A of the wire 1008 which is connected to the electrode pad 1006 in the semiconductor device 1000 related to the first embodiment is changed.

Figure 16:
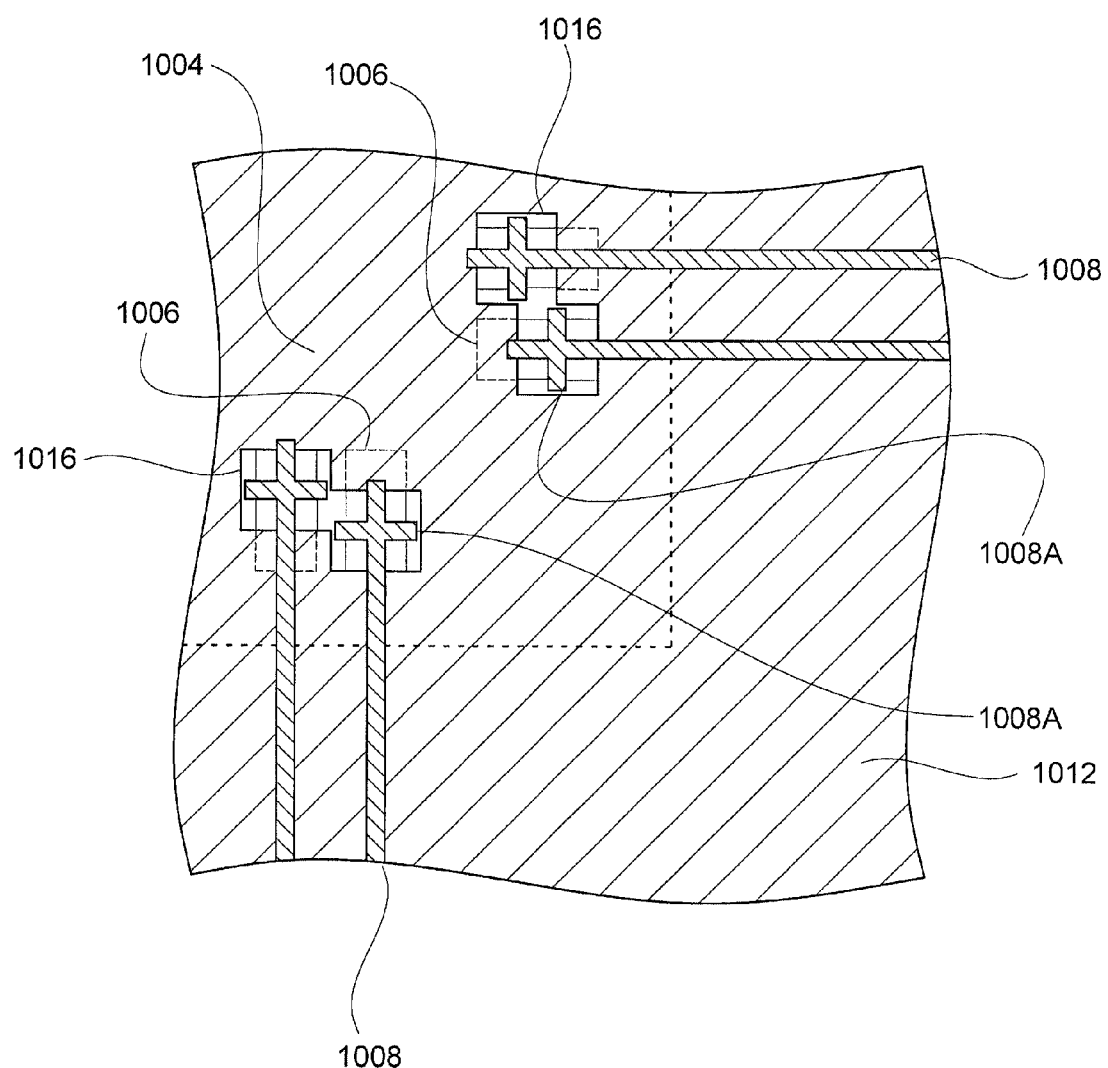
FIG. 16 is a plane view diagram which shows apertures formation of a first insulation layer and the formation of wires connected to electrode pads in one part of a semiconductor device related to a seventh embodiment of the present invention.

FIG. 16 shows a general structure of the semiconductor device 1000 related to the seventh embodiment. Furthermore, in the diagram, the second insulation layer 1014 is omitted and because the second insulation layer 1014 is explained in the first embodiment an explanation is omitted here.

As is shown in FIG. 16, the shape of the apertures 1016 may be one or a plurality of apertures 1016 which expose at least two or more of the upper part and lower parts of two adjacent electrode pads 1006 among the plurality of electrode pads 1006 which are formed on the semiconductor chip 1004. In addition, the shape of the connection part 1008A of the wire 1008 which is connected to the electrode pad 1006 formed in each apertures 1016 may be a cross shape. Furthermore, the shape of the connection part 1008A of the wire 1008 which is connected to the electrode pad 1006 formed in each apertures 1016 is not limited to a cross shape. For example, the shape of the connection part 1008A may also be a round shape or other shape. The remaining structure and manufacturing method is the same as the first embodiment.

Eighth Embodiment

A semiconductor device 1000 related to the eighth embodiment of the present invention is explained while referring to the diagrams. The eighth embodiment of the present invention explains a structural example in which the structure of the wires connected to an external terminal in the semiconductor device 1000 related to the first embodiment is changed.

Figure 17:
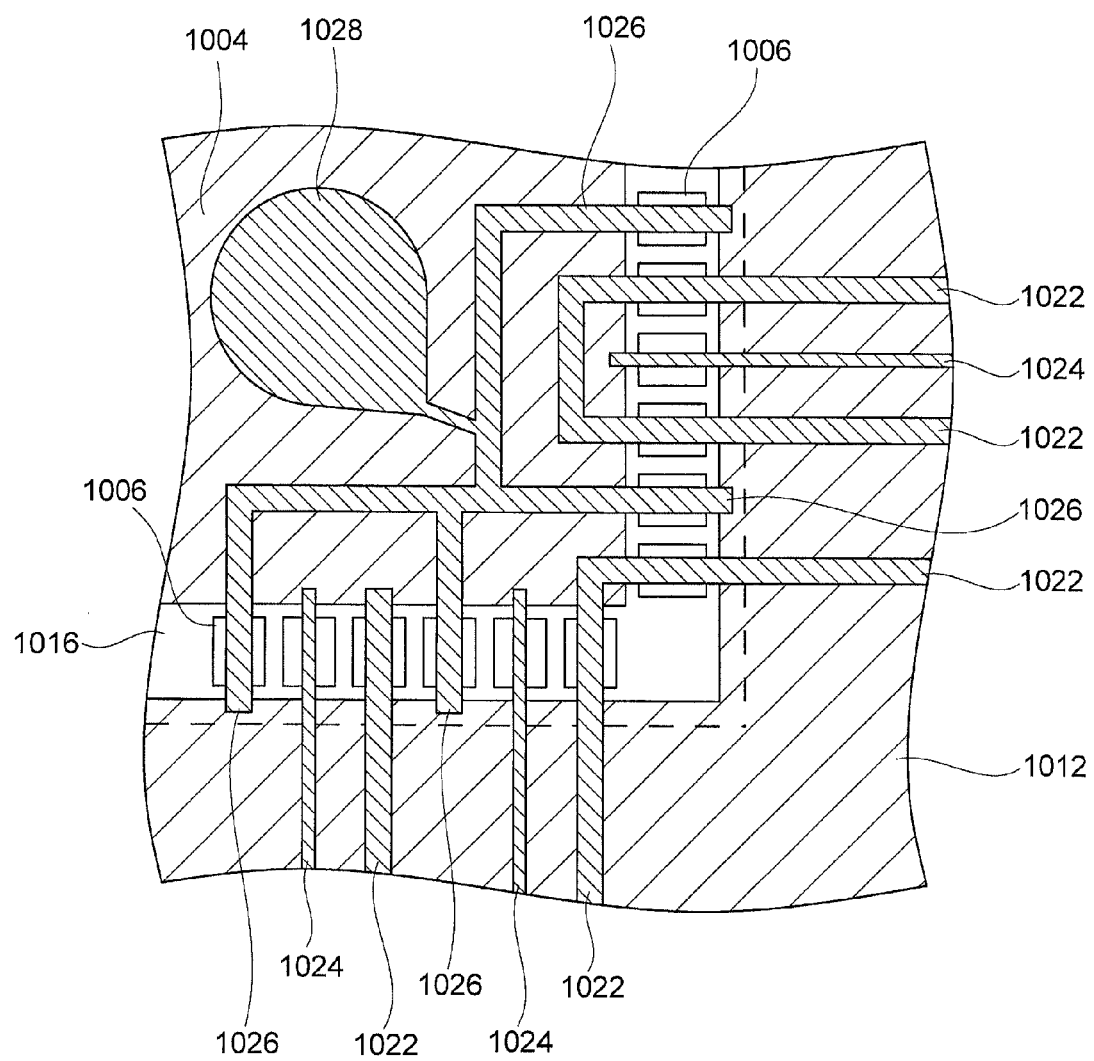
FIG. 17 is a plane view diagram which shows apertures formation of a first insulation layer and the formation of wires connected to electrode pads in one part of a semiconductor device related to an eight embodiment of the present invention.

FIG. 17 shows a general structure of the semiconductor device 1000 related to the eighth embodiment. Furthermore, in the diagram, the second insulation layer 1014 is omitted and because the second insulation layer 1014 is explained in the first embodiment an explanation is omitted here.

As is shown in FIG. 17, the same type of wires 1008 are connected in a region (upper left region of the diagram) on the interior of the apertures 1016 on the semiconductor chip 1004 which is covered by the first insulation layer 1012 and the connected wires are connected to a ball land 1028 which is used for connecting to an external terminal and which is formed in the region of the interior side of the apertures 1016 on the semiconductor chip 1004. It is possible to reduce the number of external terminals using this type of wire structure and as a result it is possible to reduce the overall size of the semiconductor device 1000. In FIG. 18, an example is shown where a ground wires 1026 are connected to the ball land 1028. However, as long as the wires are the same type, another type of wires may be connected. The type of connected wires and the arrangement relationship between wires are not limited to this example. The remaining structure and manufacturing method is the same as the first embodiment.

Ninth Embodiment

The semiconductor device 1000 related to the ninth embodiment of the present invention may be arranged with a substrate, a semiconductor chip arranged on the substrate and including a plurality of electrode pads, a first insulation layer having an apertures which exposes at least a part of at least two adjacent electrode pads among the plurality of electrode pads on the semiconductor chip, a plurality of wires which are electrically connected to the exposed plurality of electrode pads in the apertures, and a second insulation layer which covers the apertures.

In addition, the semiconductor device 1000 related to the ninth embodiment of the present invention may be arranged with a substrate, a semiconductor chip arranged on the substrate and including a plurality of electrode pads, a first insulation layer having one apertures which exposes at least a part of each electrode pad of the plurality of electrode pads on the semiconductor chip, a plurality of wires which are electrically connected to the exposed plurality of electrode pads in the apertures, and a second insulation layer which covers the apertures.

In addition, in the semiconductor device 1000 related to the ninth embodiment of the present invention, the plurality of electrode pads may be comprised of a plurality of groups comprised of two or more adjacent electrode pads, and the apertures may be formed for each of the groups of the plurality of electrode pads.

In addition, in the semiconductor device 1000 related to the ninth embodiment of the present invention, the apertures may be formed for each function of the plurality of wires.

In addition, in the semiconductor device 1000 related to the ninth embodiment of the present invention, the length of a wire which is electrically connected to at least one electrode pad may be different to the length of a wire which is electrically connected to an adjacent electrode pad.

In addition, in the semiconductor device 1000 related to the ninth embodiment of the present invention, each of the plurality of wires may be arranged across the apertures.

In addition, in the semiconductor device 1000 related to the ninth embodiment of the present invention, the length of the wire which is electrically connected to at least one of the electrode pads may be shorter than the length of the electrode pad.

In addition, in the semiconductor device 1000 related to the ninth embodiment of the present invention, the shape of the part of the plurality of wires which is electrically connected to the exposed electrode pad in the apertures may be a cross shape.

In addition, in the semiconductor device 1000 related to the ninth embodiment of the present invention, the shape of the part of the plurality of wires which is electrically connected to the exposed electrode pad in the apertures may be a round shape.

In addition, in the semiconductor device 1000 related to the ninth embodiment of the present invention, at least two wires having the same function among the plurality of wires may be connected on the first insulation layer and connected to a ball land which is used for connecting to an external terminal arranged on the first insulation layer.

In addition, the semiconductor device 1000 related to the ninth embodiment of the present invention may be manufactured by arranging a semiconductor chip having a plurality of electrode pads on a substrate, forming a first insulation layer on the substrate and the semiconductor chip, forming apertures which exposes at least one part of at least two adjacent electrode pads among the plurality of electrode pads on the first insulation layer, forming a plurality of wires which are electrically connected with the plurality of electrode pads on the first insulation layer and forming a second insulation layer which covers the apertures.

In addition, the semiconductor device 1000 related to the ninth embodiment of the present invention may be manufactured by arranging a semiconductor chip having a plurality of electrode pads on a substrate, forming a first insulation layer on the substrate and the semiconductor chip, forming one apertures which exposes at least one part of each of the plurality of electrode pads on the first insulation layer, forming a plurality of wires which are electrically connected with the plurality of electrode pads on the first insulation layer and forming a second insulation layer which covers the apertures.

In addition, in manufacturing the semiconductor device 1000 related to the ninth embodiment of the present invention, the plurality of electrode pads may be comprised of a plurality of groups comprised of two or more adjacent electrode pads and the apertures may be formed for each group of the plurality of electrode pads.

In addition, in manufacturing the semiconductor device 1000 related to the ninth embodiment of the present invention, the apertures may be formed for each function of the plurality of wires.

In addition, in manufacturing the semiconductor device 1000 related to the ninth embodiment of the present invention, the length of a wire which is electrically connected to at least one electrode pad may be different to the length of a wire which is electrically connected to an adjacent electrode pad.

In addition, in manufacturing the semiconductor device 1000 related to the ninth embodiment of the present invention, each of the plurality of wires may be arranged across the apertures.

In addition, in manufacturing the semiconductor device 1000 related to the ninth embodiment of the present invention, the length of the wire which is electrically connected to at least one of the electrode pads may be shorter than the length of the electrode pad.

In addition, in manufacturing the semiconductor device 1000 related to the ninth embodiment of the present invention, the shape of the part of the plurality of wires which is electrically connected to the exposed electrode pad in the apertures may be a cross shape.

In addition, in manufacturing the semiconductor device 1000 related to the ninth embodiment of the present invention, the shape of the part of the plurality of wires which is electrically connected to the exposed electrode pad in the apertures may be a round shape.

In addition, in manufacturing the semiconductor device 1000 related to the ninth embodiment of the present invention, at least two wires having the same function among the plurality of wires may be connected on the first insulation layer and connected to a ball land which is used for connecting to an external terminal arranged on the first insulation layer.

The invention claimed is:
1. A semiconductor device comprising:
a semiconductor chip having a plurality of electrode pads;
an insulation layer having one or more apertures which expose alternately an upper part and a lower part of each adjacent electrode pad of the plurality of electrode pads on the semiconductor chip, each of the one or more apertures exposing at least part of more than one of the plurality of electrode pads; and
a plurality of wires which are electrically connected to the exposed plurality of electrode pads.
2. The semiconductor device according to claim 1, wherein at least two wires of the plurality of wires having the same function are connected on the insulation layer and are connected to a ball land used to connect to an external terminal arranged on the insulation layer.
3. A semiconductor device comprising:
a semiconductor chip having a plurality of electrode pads;
an insulation layer having one or more apertures which expose at least a part of the plurality of electrode pads, respectively on the semiconductor chip, each of the one or more apertures exposing at least part of more than one of the plurality of electrode pads;
a plurality of wires which are electrically connected to the exposed plurality of electrode pads; and
a length of a wire of the plurality of wires, which is electrically connected to at least one electrode pad of the plurality of electrode pads, is different from the length of a wire of the plurality of wires which is electrically connected to an adjacent electrode pad of the plurality of electrode pads.

4. The semiconductor device according to claim 3, wherein at least two wires of the plurality of wires having the same function are connected on the insulation layer and are connected to a ball land used to connect to an external terminal arranged on the insulation layer.

5. A semiconductor device comprising:
a semiconductor chip having a plurality of electrode pads;
an insulation layer having one or more apertures which expose at least a part of the plurality of electrode pads, respectively on the semiconductor chip, each of the one or more apertures exposing at least part of more than one of the plurality of electrode pads; and
a plurality of wires which are electrically connected to the exposed plurality of electrode pads, at least one length of a wire of the plurality of wires, which is electrically connected to at least one electrode pad of the plurality of electrode pads, being shorter than a length of the electrode pad.

6. The semiconductor device according to claim 5, wherein at least two wires of the plurality of wires having the same function are connected on the insulation layer and are connected to a ball land used to connect to an external terminal arranged on the insulation layer.

\* \* \* \* \*